United States Patent
Murahashi

(10) Patent No.: US 7,889,109 B2
(45) Date of Patent: Feb. 15, 2011

(54) ΔΣ MODULATION DIGITAL-ANALOG CONVERTER, DIGITAL SIGNAL PROCESSING METHOD, AND AV DEVICE

(75) Inventor: Yoshimitsu Murahashi, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 12/521,441

(22) PCT Filed: Dec. 27, 2007

(86) PCT No.: PCT/JP2007/075161

§ 371 (c)(1),
(2), (4) Date: Sep. 3, 2009

(87) PCT Pub. No.: WO2008/081887

PCT Pub. Date: Jul. 10, 2008

(65) Prior Publication Data

US 2010/0315275 A1    Dec. 16, 2010

(30) Foreign Application Priority Data

Dec. 27, 2006 (JP) .............................. 2006-353292

(51) Int. Cl.
H03M 3/00 (2006.01)
(52) U.S. Cl. ..................... 341/143; 341/118; 341/120; 341/144; 330/10
(58) Field of Classification Search ......... 341/118–121, 341/143, 144
See application file for complete search history.

(56) References Cited

U.S. PATENT DOCUMENTS 6,031,481 A * 2/2000 Craven ..................... 341/200
6,414,614 B1 * 7/2002 Melanson .................. 341/143
6,441,760 B2 * 8/2002 Albinet et al. ............. 341/143

(Continued)

FOREIGN PATENT DOCUMENTS

JP    2000-307428 A    11/2000

(Continued)

*Primary Examiner*—Linh V Nguyen
(74) *Attorney, Agent, or Firm*—Birch, Stewart, Kolasch & Birch, LLP

(57) ABSTRACT

A ΔΣ modulation digital-analogue converter of the present invention includes: a look-up table in which a correspondence relationship between each of a plurality of possible input values of an input signal externally supplied, and each of compensation values individually associated with the possible input values, are stored; and a nonlinear compensation circuit (6) for compensating the input signal externally supplied, based on a compensation value associated with the input signal among the compensation values, and supplying a ΔΣ modulation section (1) the input signal thus compensated. A sine wave is used as the input signal. The compensation value is set based on magnitudes of a spectrum of odd-order harmonics whose frequencies are A times more than a frequency of the sine wave (A is an odd number), the spectrum obtained in such a manner that an output of a D-Class amplifier (2) or an output of the ΔΣ modulation digital-analogue converter is subjected to a frequency analysis without a compensation with respect to the sine wave by the nonlinear compensation circuit (6). Therefore, it is possible to provide a ΔΣ modulation digital-analogue converter which (i) suppresses generation of odd-order harmonics with a simple circuit arrangement, and therefore (ii) is excellent in SNR and THD+N.

18 Claims, 23 Drawing Sheets

U.S. PATENT DOCUMENTS

| | | |
|---|---|---|
| 6,473,133 B1 | 10/2002 | Twitchell et al. |
| 6,515,604 B2 * | 2/2003 | Delano ................... 341/143 |
| 6,795,004 B2 * | 9/2004 | Masuda et al. ........... 341/143 |
| 7,317,758 B2 * | 1/2008 | Alrutz et al. ............. 375/238 |
| 7,626,519 B2 * | 12/2009 | Risbo ...................... 341/53 |
| 7,728,658 B2 * | 6/2010 | Andersen et al. ......... 330/10 |
| 2002/0079965 A1 | 6/2002 | Maniwa et al. |
| 2004/0051654 A1 | 3/2004 | Ohkuri et al. |
| 2007/0005160 A1 * | 1/2007 | Zaucha et al. ............ 700/94 |
| 2008/0123873 A1 * | 5/2008 | Bjorn-Josefsen et al. .... 381/106 |
| 2008/0278230 A1 * | 11/2008 | Kost et al. ............... 330/10 |
| 2009/0289705 A1 * | 11/2009 | Kobayashi et al. ........ 330/10 |

FOREIGN PATENT DOCUMENTS

| | | |
|---|---|---|
| JP | 2003-500876 A | 1/2003 |
| JP | 2003-133959 A | 5/2003 |
| JP | 2004-088430 A | 3/2004 |
| JP | 2004-88430 A | 3/2004 |
| JP | 2006-115028 A | 4/2006 |
| JP | 2006-121529 A | 5/2006 |
| JP | 2003-500876 A | 1/2007 |
| WO | WO-00/74232 A1 | 12/2000 |

* cited by examiner

F I G. 9
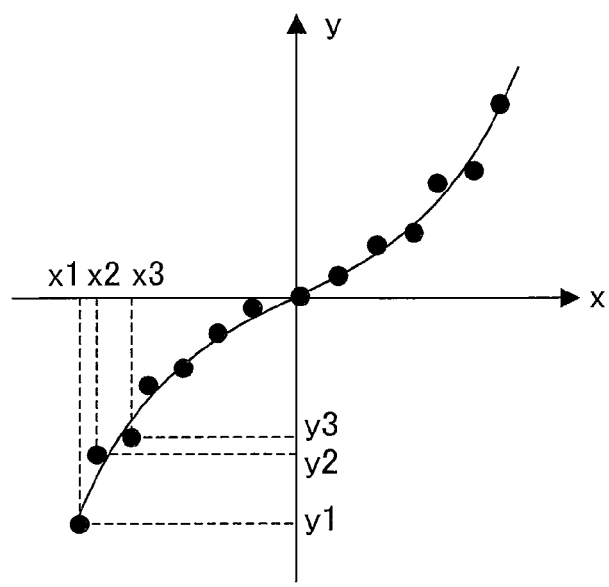
F I G. 10
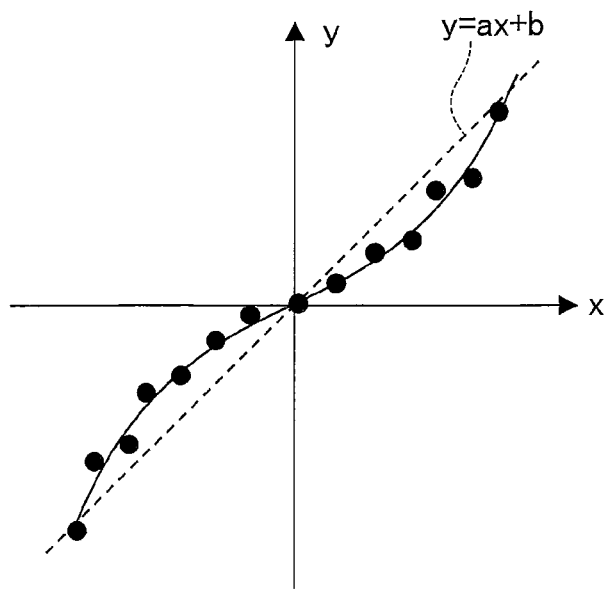

F I G. 1 1
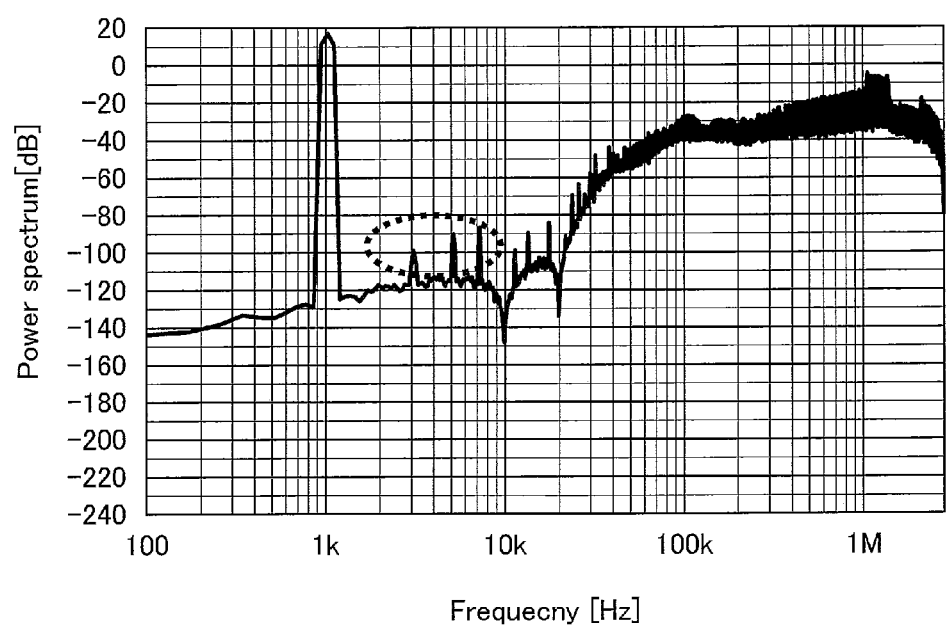

ΔΣ MODULATION DIGITAL-ANALOG CONVERTER, DIGITAL SIGNAL PROCESSING METHOD, AND AV DEVICE

TECHNICAL FIELD

The present invention relates to: a ΔΣ modulation digital-analogue converter; a digital signal processing method; and an AV device, each of which (i) controls switching of a D-Class amplifier according to a signal that has been encoded by ΔΣ modulation, and (ii) outputs an analogue signal converted and amplified from an inputted digital signal.

BACKGROUND ART

In recent years, a one-bit encoding technique employing ΔΣ modulation has been widely applied to fields relating to a digital audio system, an AD/DA conversion device, and the like. For example, the ΔΣ modulation has been employed in a D-Class amplifier which amplifies an input signal by switching a transistor. Unlike an A-Class amplifier that works while the transistor is in a linear region (unsaturated region), the D-Class amplifier operates while the transistor is in a nonlinear region (saturated region). Therefore, the D-Class amplifier has an advantage of being capable of amplifying electric power highly efficiently.

The D-Class amplifier switches over constant voltages to each other in accordance with an input signal. Basically, the D-Class amplifier outputs a binary, that is, (i) a voltage corresponding to an input signal indicating "ON" and (ii) a voltage corresponding to an input signal indicating "OFF". In other words, the D-Class amplifier amplifies a binary input indicating "ON/OFF". Accordingly, for example, in a case where an audio signal is amplified by use of the D-Class amplifier, first, a binary signal indicating the audio signal is created. In other words, it is necessary to encode the audio signal into a one-bit signal. A method adopting the ΔΣ modulation has been put into practical use in encoding the audio signal into the one-bit signal.

FIG. 13 is a view illustrating an arrangement of a conventional ΔΣ modulation one-bit amplifier. The ΔΣ modulation D-Class amplifier includes a DA converter (DAC) 50, a subtractor 51, a group of analogue integrators 52, a quantizer 53, a D-Class amplifier 54, a low-pass filter 55, and a speaker 56. The ΔΣ modulation one-bit amplifier amplifies an input signal that is encoded by PCM (Pulse Code Modulation), and outputs an analogue signal converted and amplified from the input signal. The following description explains how each component of the ΔΣ modulation one-bit amplifier is operated.

The DAC 50 receives a digital signal that is encoded from an audio signal by the PCM. The DAC 50 converts the inputted digital signal into an analogue signal, and outputs the analogue signal to the subtractor 51. Further, a switching pulse that is outputted from the D-Class amplifier 54 is fed back to the subtractor 51. The switching pulse outputted from the D-Class amplifier 54, and the feedback will be described later more specifically.

The subtractor 51 subtracts, from the analogue signal received from the DAC 50, the switching pulse that is fed back from the D-Class amplifier 54, so as to create a difference signal. Then, the subtractor 51 outputs the difference signal to the group of analogue integrators 52. The group of analogue integrators 52 integrates the difference signal received from the subtractor 51, and then outputs the difference signal to the quantizer 53.

The quantizer 53 quantizes, at every predetermined sampling cycle, the input received from the group of analogue integrators 52, so as to create a binary quantized signal, i.e. "0" or "1". Then, the quantizer 53 outputs the quantized signal to the D-Class amplifier 54.

The D-Class amplifier 54 carries out the switching in accordance with the quantized signal, so as to change over a constant voltage to another constant voltage. This generates a high-voltage switching pulse corresponding to the quantized signal, in other words, the quantized signal is amplified. The D-Class amplifier 54 outputs the switching pulse to the low-pass filter 55. The low-pass filter 55 smoothes the switching pulse so as to demodulate the switching pulse. Then, the low-pass filter 55 outputs, from the speaker 56, the switching pulse as such an analogue signal that an original audio signal is amplified.

As described above, the ΔΣ modulation one-bit amplifier includes a feedback loop which negatively feeds back, to the subtractor 51, the switching pulse outputted from the D-Class amplifier 54. This makes it possible to feed back, to the subtractor 51, analogue information (including power source fluctuation noise, a switching error component, and the like) which is included in the output of the D-Class amplifier 54. Accordingly, the power source fluctuation noise and the switching error component can be compensated so that an SNR (Signal to Noise Ratio) is improved and a "THD (Total Harmonic Distortion)+N (Noise)" is reduced.

However, since the feedback loop for feeding back the analogue information is provided in the arrangement of this ΔΣ modulation one-bit amplifier, it is necessary for the arrangement to include the DAC 50 or the like. This increases costs.

FIG. 14 is a view illustrating an arrangement of a conventional ΔΣ modulation one-bit amplifier which does not include a feedback loop for feeding back the analogue information.

This ΔΣ modulation one-bit amplifier includes: a subtractor 60; a group of digital integrators 61; a quantizer 62; a D-Class amplifier 63; a low-pass filter 64; and a speaker 65. The subtractor 60, the group of the digital integrators 61, and the quantizer 62 constitute a ΔΣ modulation section 66. This ΔΣ modulation one-bit amplifier amplifies an input signal that has been digitally-encoded by the PCM, and then outputs an analogue signal thus prepared from the input signal. The following description deals with how each component of the ΔΣ modulation one-bit amplifier is operated.

The subtractor 60 receives a digital signal that has been encoded from an audio signal by the PCM. Further, a quantized signal outputted from the quantizer 62 is fed back to the subtractor 60. The quantized signal outputted from the quantizer 62, and the feedback will be described later more specifically.

The subtractor 60 subtracts, from the input signal (that is, the digital signal that is encoded from an audio signal by the PCM), the quantized signal that is fed back from the quantizer 62, so as to create a difference signal. Then, the subtractor 60 outputs the difference signal to the group of digital integrators 61.

The group of digital integrators 61 integrates the difference signal received from the subtractor 60, and then outputs the difference signal to the quantizer 62. The quantizer 62 quantizes, at every predetermined sampling cycle, the input received from the group of digital integrators 61, so as to create a binary quantized signal indicating "0" and "1". Then, the quantizer 62 outputs the quantized signal to the D-Class amplifier 63.

The D-Class amplifier 63 carries out the switching in accordance with the quantized signal, so as to change over a constant voltage to another constant voltage. This generates a high-voltage switching pulse corresponding to the quantized signal, in other words, the quantized signal is amplified. The D-Class amplifier 63 outputs the switching pulse to the low-pass filter 64. The low-pass filter 64 smoothes and demodulates the switching pulse, and outputs an analogue signal from the speaker 65, the analogue signal thus prepared from the original audio signal. As described above, the ΔΣ modulation section 66 includes a feedback loop for negatively feeding back, to the subtractor 60, the quantized signal outputted from the quantizer 62.

Further, in recent years, for an audio amplifier employing a D-Class amplifier (switching amplifier), a technique employing the ΔΣ modulation has been proposed. For example, Patent Literature 1 discloses a technique for suppressing harmonic distortion of a signal for driving the switching amplifier (D-Class amplifier).

In an arrangement disclosed in Patent Literature 1, (i) a PWM (Pulse Width Modulation) signal is created in such a manner that an inputted digital signal is quantized by a ΔΣ converter, and then is subjected to PWM, and (ii) the switching amplifier is driven by the PWM signal. Harmonic distortion due to the PWM is estimated in advance, and suppressed by canceling out a component of the harmonic distortion. The estimation of the harmonic distortion in advance may be based on a linear combination of a product with the use of an original signal, and signals indicating first-order and second-order temporal differential signals of a continuous-time signal corresponding to the original input signal. At that time, a fundamental harmonic component which is generated due to a third-order distortion is taken into consideration.

Further, Patent Literature 2 discloses a technique in which, in a ΔΣ digital-analogue converter and an output amplifying circuit, each of which includes a ΔΣ conversion circuit, a PWM circuit, and a distortion compensation circuit, a second-order harmonic generated in the PWM circuit or a PWM signal received from the PWM circuit is inputted, so that generation of a second-order harmonic in a D-Class amplifier or the like is suppressed.

Citation List
  Patent Literature
  Japanese Patent Application Publication, Tokukai, No. 2006-115028 A (Publication Date: Apr. 27, 2006)
  Patent Literature 2
  Japanese Patent Application Publication, Tokukai, No. 2003-133959 A (Publication Date: May 9, 2003)

SUMMARY OF INVENTION

However, with the arrangement of the conventional ΔΣ modulation one-bit amplifier which does not include the feedback loop for feeding back the analogue information, it is impossible to feed back the analogue information (including the power source fluctuation noise and the switching error component, both of which are generated in the D-Class amplifier 63) which is included in the output of the D-Class amplifier 63. Accordingly, the power source fluctuation noise and the switching error component cannot be compensated. This causes problems of deterioration in SNR, and an increase in THD+N. The following description deals with the problems more specifically.

FIG. 15 is a diagram showing a frequency spectrum of a signal and noise both of which are included in an output signal, in a case where a sine wave is inputted into a conventional ΔΣ modulation D-Class amplifier. FIG. 15 shows a frequency spectrum obtained in such a manner that the output signal of the ΔΣ modulation D-Class amplifier 63 is subjected to a frequency-analysis. The frequency spectrum in the vicinity of 1 kHz shows a signal component of an amplified fundamental harmonic (sine wave).

On the other hand, in the frequency spectrum, a plurality of peaks generated in the vicinity of a range from 3 kHz to 10 kHz show odd-order harmonics (sine waves each of which has a frequency A times that of the fundamental harmonic: A is an odd number). That is, in addition to such a signal component that the sine wave of the fundamental harmonic is amplified, the output signal of the ΔΣ modulation D-Class amplifier includes odd-order harmonic components of the fundamental harmonic in a human-audible frequency range (from 20 Hz to 20 kHz) so that the odd-order harmonic components can be heard by a human as noise.

Generation of the harmonic components causes the ΔΣ modulation D-Class amplifier to have deterioration in SNR and an increase in THD+N.

With the arrangement disclosed in Patent Literature 1, it is possible to logically compensate harmonics generated in the conversion of the ΔΣ modulation to the PWM. However, analogue factors of a switching amplifier, that is, harmonics generated in the switching amplifier due to a dead time or a power source fluctuation, are not taken into consideration. Further, distortion components higher than a third-order distortion component are also not taken into consideration.

Furthermore, Patent Literature 1 does not disclose details of an effect of improving a distortion characteristic in accordance with an amplitude value of an input. Moreover, it is believed that even if the compensation is effective with respect to certain amplitude of an input signal, there is a case where the compensation is not effective with respect to other amplitude of the input signal.

Further, with the arrangement disclosed in Patent Literature 2, it is necessary to add n compensation circuits and m compensation circuits to an upstream of ΔΣ modulation means. This causes the circuit to be more complicated. Furthermore, Patent Literature 2 does not take into consideration distortion components other than a second-order distortion component.

Moreover, Patent Literature 2 does not disclose details of the effect of improving the distortion characteristic in accordance with an amplitude value of an input. Further, it is believed that even if the compensation is effective with respect to certain amplitude of an input signal, there is a case where the compensation is not effective with respect to other amplitude of the input signal.

The present invention is made in view of the problems described above. An object of the present invention is to provide a ΔΣ modulation digital-analogue converter which, with a simple circuit arrangement, suppresses not only generation of a third-order harmonic but also generation of odd-order (higher than third-order) harmonics while taking amplitude of an input into consideration, and thereby is excellent in SNR and THD+N.

In order to attain the object, a ΔΣ modulation digital-analogue converter of the present invention includes: ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means; a switching amplifier for generating a switching pulse in accordance with the quantized signal; a low-pass filter for demodulating the switching pulse; storage means in which a first compensation function is stored in advance, the first compensation function indicating a correspondence relationship between each of a plurality of possible input values of an input signal which is externally supplied, and each of compensation values that are individually associated with the possible input values; and compensation means for compensating the input signal which is externally supplied, based on a compensation value associated with the input signal among the compensation values, and supplying to the ΔΣ modulation means the input signal thus compensated; the first compensation function being set based on a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency-analysis without a compensation carried out with respect to the input signal by the compensation means.

Further, in order to attain the object, a digital signal processing method of the present invention employs a ΔΣ modulation digital-analogue converter, the ΔΣ modulation digital-analogue converter including: ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means; a switching amplifier for generating a switching pulse in accordance with the quantized signal; a low-pass filter for demodulating the switching pulse, the method including: providing, to the ΔΣ modulation digital-analogue converter, storage means in which a first compensation function is stored in advance, the first compensation function indicating a correspondence relationship between each of a plurality of possible input values of an input signal which is externally supplied, and each of compensation values that are individually associated with the possible input values; and providing compensation means to the ΔΣ modulation digital-analogue converter and compensating, by the compensation means, the input signal which is externally supplied, based on a compensation value associated with the input signal among the compensation values, and supplying, by the compensation means, to the ΔΣ modulation means the input signal thus compensated, the first compensation function being set based on a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency-analysis without a compensation carried out with respect to the input signal by the compensation means.

The ΔΣ modulation digital-analogue converter includes the switching amplifier for amplifying, into a large amplitude voltage, a small amplitude voltage of a binary or trinary quantized signal received from the quantizing means.

This switching amplifier and the low-pass filter (the switching amplifier, in particular) have not a linear relationship between an input signal and an output signal, but a nonlinear relationship. Therefore, for example, in a case where a certain sine wave is inputted into the ΔΣ modulation digital-analogue converter, and the spectrum that can be obtained by measuring the output is measured by use of a spectrum analyzer, there is a problem of generation of harmonics (odd-order harmonics) are at frequencies A times (A is an odd number not less than three) (that is, three times, five times, seven times . . . ) that of the sine wave.

Accordingly, it has been difficult to carry out faithful amplification, which is an important role of the D-Class amplifier used in the ΔΣ modulation digital-analogue converter.

In view of this problem, the inventors of the present invention found that an influence due to the nonlinear characteristic of the switching amplifier and/or the nonlinear characteristic of the low-pass filter depends on the input signal that is to be received by the ΔΣ modulation digital-analogue converter.

Based on this finding, in the present invention, a relationship between an input signal which is externally supplied, and an output signal is examined, and, in consideration of the influence of the nonlinear characteristic of the switching amplifier and/or the nonlinear characteristic of the low-pass filter, the input signal is compensated in the upstream of the switching amplifier.

According to the arrangement of the present invention, the ΔΣ modulation digital-analogue converter includes the storage means in which a first compensation function has been stored in advance, the first compensation function indicating a correspondence relationship between each of a plurality of input values which are possible values of an input signal which is externally supplied, and each of compensation values that have been uniquely determined in accordance with respective input values; and compensation means for compensating the input signal which is externally supplied, based on a compensation value associated with the input signal among the compensation values, and supplying the ΔΣ modulation means the input signal thus compensated. Further, the compensation value is set based on magnitudes of a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency analysis (that is, Fourier transform) without a compensation carried out with respect to the input signal by the compensation means.

As described above, the odd-order harmonics depend on the influence that is generated, in accordance with the input signal, due to the nonlinear characteristic of the switching amplifier and/or the nonlinear characteristic of the low-pass filter. Therefore, by compensating the input signal in accordance with the output signal in advance, it becomes possible to suppress the odd-order harmonics whose frequencies are A times that of the inputted sine wave (A is an odd number), the odd-order harmonics generated by the nonlinear characteristic of the switching amplifier and/or the low-pass filter.

Furthermore, the present invention can be applied to various switching amplifiers by setting compensation values appropriately. Moreover, it is unnecessary to provide a complicated circuit in the upstream of the ΔΣ modulation means.

Further, in the ΔΣ modulation digital-analogue converter of the present invention, the first compensation function is preferably obtained by combining second compensation functions, which are respectively for different amplitude values of the input signal, and indicate correspondence relationships between the possible input values and the compensation values for the different amplitude values, respectively.

With the arrangement, the first compensation function is obtained by combining the second compensation functions, which are respectively for different amplitude values of the input signal, and indicate the correspondence relationships between the possible input values and the compensation values for the different amplitude values. Thereby, it is possible to compensate the distortion in a wider range of the amplitude values.

Furthermore, in the ΔΣ modulation digital-analogue converter of the present invention, the first compensation function is preferably obtained in such a manner that (i) second compensation functions, which are respectively for different amplitude values of the input signal, and respectively indicate correspondence relationships between the possible input values and the compensation values for the different amplitude value, are combined, and (ii) a resulting combined function is subjected to curve fitting.

If the curve fitting is carried out as described above, the following three advantages are achieved. (i) It is possible to reduce factors of the combined function as compared with a case where the function is obtained by merely combining functions. In other words, it is possible to cause the factors of the combined function to be into a set of factors. (ii) It becomes unnecessary to switch over the factors between measured amplitude values. This can provide more convenient processing. (iii) It becomes possible to improve acoustic quality by eliminating discontinuous points.

Moreover, in the ΔΣ modulation digital-analogue converter of the present invention, the second functions are preferably combined in such a manner that combination of a second function corresponding to a highest amplitude value and a second function corresponding to a second-highest amplitude value is carried out one by one sequentially.

Further, in the ΔΣ modulation digital-analogue converter of the present invention, the first compensation function is preferably stored in the storage means per impedance of a load.

The compensation values differ from each other depending on the impedance of the load. With the arrangement, the compensation value is determined for each impedance of a load, so that it is possible to carry out the compensation in accordance with each load with the use of an appropriate compensation value.

Furthermore, in the ΔΣ modulation digital-analogue converter of the present invention, the load is preferably speaker.

Moreover, in the ΔΣ modulation digital-analogue converter of the present invention, the load is preferably an electric circuit network connected to a plurality of speakers.

Further, in the ΔΣ modulation digital-analogue converter of the present invention, the ΔΣ modulation digital-analogue converter is capable of dealing with electric power for driving a load.

Furthermore, the ΔΣ modulation digital-analogue converter of the present invention preferably further includes subtracting means for (i) creating a difference signal by subtracting the compensation value from the input signal which is externally supplied, and (ii) inputting the difference signal into the ΔΣ modulation means.

With the arrangement, the ΔΣ modulation digital-analogue converter of the present invention further includes the subtracting means for (i) creating the difference signal by subtracting the compensation value from the input signal which is externally supplied, and (ii) inputting the difference signal into the ΔΣ modulation section. Therefore, a distortion component added by the switching amplifier may be merely inputted into the storage means. With the arrangement, it is possible to easily determine the compensation value which will be inputted into the storage means, and simultaneously, to reduce the amount of the memory which will be inputted into the storage means.

Moreover, the ΔΣ modulation digital-analogue converter of the present invention preferably further includes adding means for (i) creating a sum signal by adding the compensation value to the input signal which is externally supplied, and (ii) inputting the sum signal into the ΔΣ modulation means.

Further, in the ΔΣ modulation digital-analogue converter of the present invention, the compensation value is preferably inputted into the ΔΣ modulation means.

Furthermore, in the ΔΣ modulation digital-analogue converter, the compensation value is preferably obtained by calculation in which amplitude values of the input signal and amplitude values of the odd-order harmonics are used.

The inventors of the present invention found that in a case where (i) the sine wave and the amplitude values of the sine wave are not compensated by the compensation means, and (ii) the compensation values are determined by use of the amplitude values of the odd-order harmonics, which amplitude values are obtained by measuring the output of the switching amplifier, the relationship between the input signal which is externally supplied and the output of the switching amplifier shows substantially a linear relationship, and thereby the odd-order harmonics are suppressed.

Moreover, in the ΔΣ modulation digital-analogue converter of the present invention, the amplitude values of harmonics that are equal to or higher than a third-order harmonic are preferably determined such that (i) if the harmonics and a first-order harmonic have in-phase components, signs of the amplitude values are positive, and (ii) if the harmonics and the first-order harmonic have out-of-phase components, the signs of the amplitude values are negative.

Further, in the ΔΣ modulation digital-analogue converter of the present invention, the compensation value is preferably $y_i-(ax_i+b)$, where: the input signal which is externally supplied is not subjected to the compensation by the compensation means; and a and b are worked out by a least square method from an input value $x_i$ (i=1, 2, ..., N; N is an integer more than 2) of the input signal, and an output value $y_i$ (i=1, 2, ..., N; N is an integer more than 2) of an output signal so that $E=\Sigma_{i=1}^{N}\{(ax_i+b)-y_i\}^2$ becomes its minimum.

In the case where the compensation means does not carry out the compensation, the linear characteristic between an input signal and an output signal is not retained due to the nonlinear characteristic of the switching amplifier, as described above.

Meanwhile, with the arrangement, a correspondence relationship between an input value $x_i$ (i=1, 2, ..., N; N is an integer more than 2) of the input signal, and an output value $y_i$ (i=1, 2, ..., N; N is an integer more than 2) of an output signal is determined, and a and b, which are factors of an equation of a straight line that is most approximate to the relationship between $x_i$ and $y_i$, are worked out by a least square method. If x is compensated in advance based on a result of the working out, it is possible to cause the input and output of the ΔΣ modulation to have a linear relationship (that is, it is possible to cause the output y of the ΔΣ modulation to be close to the equation of a straight line of "ax+b"). This makes it possible to suppress the odd-order harmonics.

Furthermore, in the ΔΣ modulation digital-analogue converter, the compensation value is preferably $(1+a)x_i-y_i+b$, where: the input signal which is externally supplied is not subjected to the compensation by the compensation means; and a and b are calculated by a least square method from an input value $x_i$ (i=1, 2, ..., N; N is an integer more than 2) of the input signal, and an output value $y_i$ (i=1, 2, ..., N; N is an integer more than 2) of an output signal so that $E=\Sigma_{i=1}^{N}\{(ax_i+b)-y_i\}^2$ becomes its minimum.

In a case where the compensation means does not carry out the compensation, the linear relationship between an input signal and an output signal is not retained due to the nonlinear characteristic of the switching amplifier as described above.

Meanwhile, with the arrangement, a correspondence relationship between an input value $x_i$ (i=1, 2, ..., N; N is an integer more than 2) of the input signal, and an output value $y_i$ (i=1, 2, ..., N; N is an integer more than 2) of an output signal is determined, and a and b, which are factors of an equation of a straight line that is most approximate to the relationship between $x_i$ and $y_i$, are worked out by the least square method. If x is compensated in advance based on a result of the working out, it is possible to cause the input and output of the ΔΣ modulation to have a linear relationship (that is, it is possible to cause the output y of the ΔΣ modulation to be close to the equation of a straight line of "ax+b"). This makes it possible to suppress the odd-order harmonics.

In order to attain the object, a ΔΣ modulation digital-analogue converter of the present invention includes: ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means; a switching amplifier for generating a switching pulse in accordance with the quantized signal; a low-pass filter for demodulating the switching pulse; calculating means for calculating, in accordance with an output of the switching amplifier or an output of the ΔΣ modulation digital-analogue converter, each of compensation values that compensate individually a plurality of possible input values of an input signal which is externally supplied; and compensation means for compensating the input signal which is externally supplied, based on a compensation value associated with the input signal among the compensation values, and supplying to the ΔΣ modulation means the input signal thus compensated, the calculating means working out the compensation value based on magnitudes of a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency analysis without a compensation carried out with respect to the input signal by the compensation means.

The ΔΣ modulation digital-analogue converter includes the switching amplifier for amplifying, into a large amplitude voltage, a small amplitude voltage of the binary or trinary quantized signal received from the quantizing means.

This switching amplifier and the low-pass filter (the switching amplifier, in particular) have not the linear relationship between the input signal and the output signal but the nonlinear relationship. Therefore, for example, in a case where a certain sine wave is inputted into the ΔΣ modulation digital-analogue converter, and the spectrum obtained by measuring the output is measured by use of the spectrum analyzer, there is a problem of generation of harmonics (odd-order harmonics) at frequencies A times (A is an odd number not less than three) (that is, three times, five times, seven times ...) more than the sine wave.

Accordingly, it has been difficult to carry out the amplification, which is an important role of the D-Class amplifier used in the ΔΣ modulation digital-analogue converter.

In view of the problem, the inventors of the present invention found that, first, the influence due to the nonlinear characteristic of the switching amplifier and/or the nonlinear characteristic of the low-pass filter depends on the input signal received by the ΔΣ modulation digital-analogue converter.

Based on this finding, in the present invention, a relationship between an input signal which is externally supplied, and the output signal is examined, and, in consideration of the influence of the nonlinear characteristic of the switching amplifier and/or nonlinear characteristic of the low-pass filter, the input signal is compensated in a stage located before the switching amplifier.

With the arrangement, the ΔΣ modulation digital-analogue converter includes: calculating means for calculating, in accordance with an output of the switching amplifier or an output of the ΔΣ modulation digital-analogue converter, each of compensation values that compensate, respectively, a plurality of input values which are possible values of an input signal which is externally supplied; and compensating means for compensating the input signal which is externally supplied, based on a compensation value associated with the input signal among the compensation values, and supplying the ΔΣ modulation means the input signal thus compensated. Further, the calculating means calculates the compensation value based on a spectrum of odd-order harmonics whose frequencies are A times more than a frequency corresponding to the input signal (A is an odd number), the frequency being obtained in such a manner that an output of the switching amplifier or an output of the ΔΣ modulation digital-analogue converter is subjected to a frequency analysis without a compensation carried out with respect to the input signal by the compensation means.

As described above, the odd-order harmonics depend on the influence generated in accordance with the input signal, due to the nonlinear characteristic of the switching amplifier and/or the nonlinear characteristic of the low-pass filter. Therefore, by compensating the input signal in accordance with the output signal in advance, it is possible to suppress the odd-order harmonics generated due to the nonlinear characteristic of the switching amplifier and/or the nonlinear characteristic of the low-pass filter.

Further, the present invention can be applied to various switching amplifiers by appropriately setting the compensation value.

Further, an AV device of the present invention preferably includes any of the ΔΣ modulation digital-analogue converters described above.

Additional objects, features, and strengths of the present invention will be made clear by the description below. Further, the advantages of the present invention will be evident from the following explanation in reference to the drawings.

BRIEF DESCRIPTION OF DRAWINGS

FIG. 9 is a view illustrating a correspondence relationship between an input signal and an output signal in a case where a value of the look-up table is determined by use of a least-square method.

FIG. 10 is such a view that a straight line with which a difference between the input signal and the output signal becomes a minimum is added to FIG. 9.

FIG. 11 is a view showing a state where the odd-order harmonics were suppressed by use of the present embodiment.

REFERENCE SIGNS LIST

1. $\Delta\Sigma$ MODULATION SECTION ($\Delta\Sigma$ MODULATION MEANS)
2. D-CLASS AMPLIFIER (SWITCHING AMPLIFIER)
3. LOW-PASS FILTER
4. GROUP OF INTEGRATORS (INTEGRATING MEANS)
5. QUANTIZER (QUANTIZING MEANS)
6. NON LINEAR COMPENSATION CIRCUIT (COMPENSATION MEANS)
7. SUBTRACTOR (SUBTRACTING MEANS)

DESCRIPTION OF EMBODIMENTS

First Embodiment

General Arrangement of $\Delta\Sigma$ Modulation Digital-Analogue Converter

Figure 1:
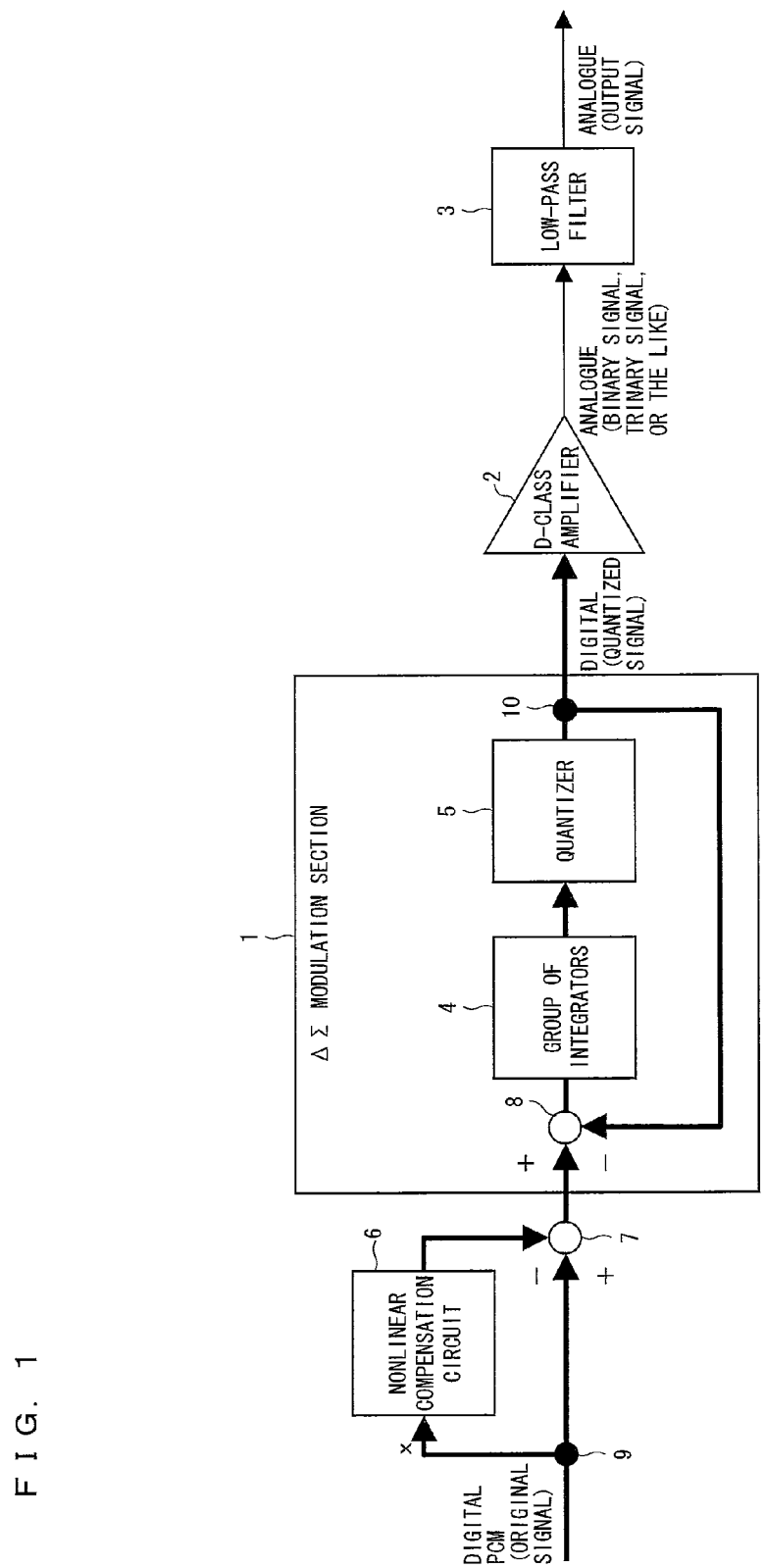
FIG. 1 is a block diagram illustrating a ΔΣ modulation digital-analogue converter of an embodiment of the present invention.

A $\Delta\Sigma$ modulation digital-analogue converter of the present embodiment includes: a $\Delta\Sigma$ modulation section (A modulation means) 1; a D-Class amplifier (switching amplifier; SW amplifier) 2; an LPF (Low Pass Filter) 3; a nonlinear compensation circuit (compensation means) 6; and a subtractor (subtracting means) 7, as illustrated in FIG. 1. In the downstream of the low-pass filter 3, a speaker 11 (see FIG. 3) is provided. The $\Delta\Sigma$ modulation section 1 receives a digital signal (original signal) that is encoded from an audio signal of a CD or the like by PCM.

The $\Delta\Sigma$ modulation digital-analogue converter of the present embodiment includes not only a converter dealing with a low electric power (small signal) for almost no load, but also a converter dealing with a large signal for driving a speaker, for example.

The $\Delta\Sigma$ modulation section 1 adds quantization noise generated in the D-Class amplifier to the digital signal, so as to create a binary (or trinary) quantized signal for faithfully amplifying the original signal in the D-Class amplifier 2. This $\Delta\Sigma$ modulation section 1 includes: a subtractor 8; a group of integrators (integrating means) 4; and a quantizer (quantizing means) 5 provided in the downstream of the group of integrators 4, as illustrated in FIG. 1. The quantized signal outputted from the quantizer 5 is fed back to the subtractor 8 provided in the upstream of the group of integrators 4. The subtractor 8 subtracts the quantized signal from the signal received from the upstream of the $\Delta\Sigma$ modulation section 1, the quantized signal being created by the quantizer 5. Thereby the subtractor 8 creates a difference signal.

Details of an internal arrangement of the group of integrators 4 are not illustrated in FIG. 1 for the sake of simple illustration. However, for example, the group of integrators 4 includes: a plurality of integrators whose transfer function is such that, for example, a plurality of "$1/(1-z^{-1})$" are continuously connected, and/or a plurality of "$1/(1-z^{-1})$" are partially fed back; and multipliers provided between the respective integrators. The group of integrators 4 performs integration of the difference signal, and then outputs the integrated difference signal to the quantizer 5.

The quantizer 5 quantizes, at every predetermined sampling cycle, the output of the group of integrators 4, so as to create a binary ("0" or "1") quantized signal. Then, the quantizer 5 outputs the quantized signal to the D-Class amplifier 2. The quantizer 5 of the present embodiment is not limited to the one that creates a binary signal, and may be the one that creates a trinary signal. In a case where the quantizer 5 creates a trinary signal, the arrangement requires more signal lines via which the quantizer 5 and the D-Class amplifier 2 are connected to each other.

Figure 2:
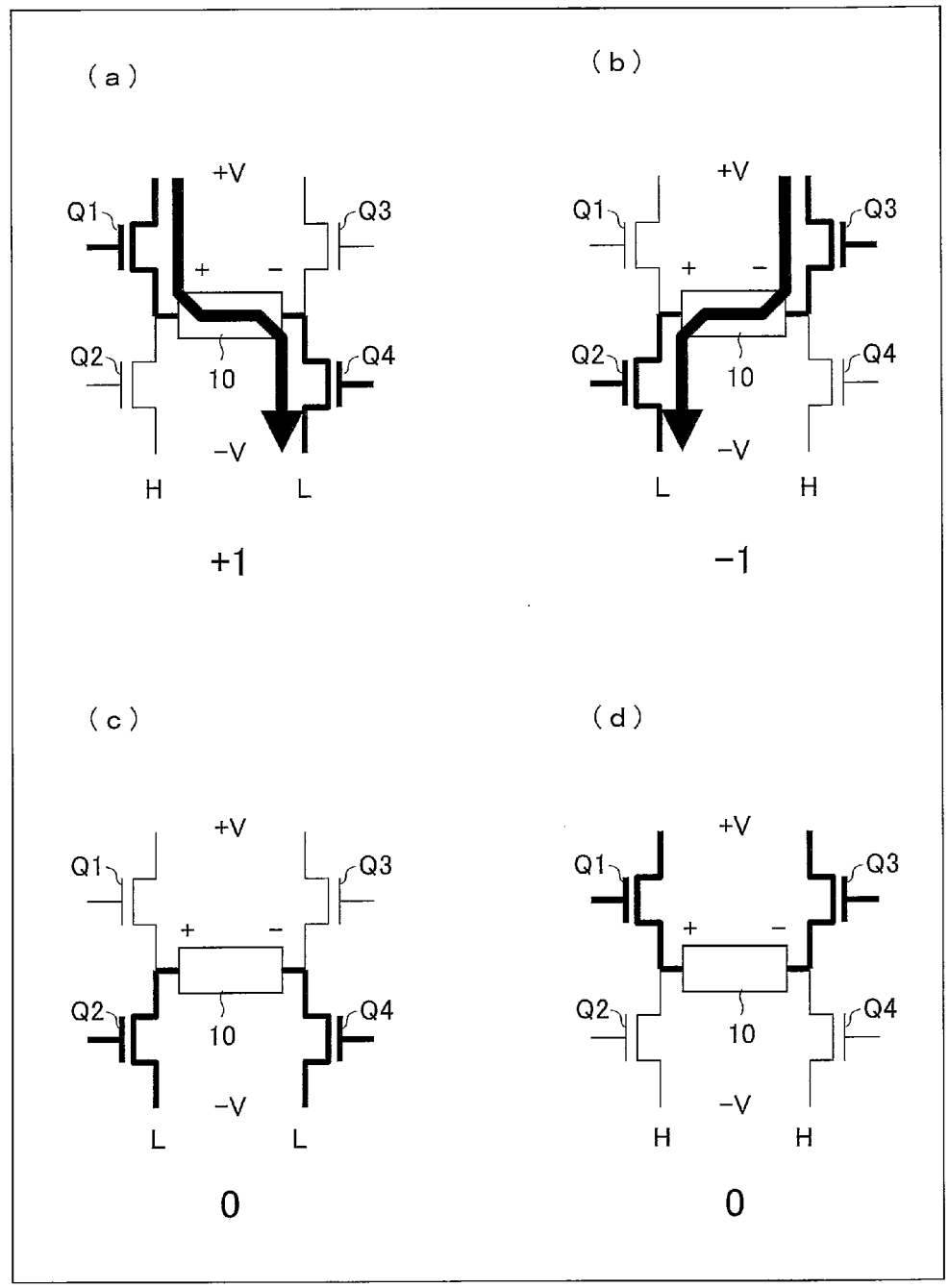
FIG. 2 is a detailed circuit diagram of a D-Class amplifier illustrated in FIG. 1, and (a) of FIG. 2 illustrates a current flow in a case where an output of the D-Class amplifier is "+1", (b) of FIG. 2 illustrates a current flow in a case where the output of the D-Class amplifier is "−1", and (c) and (d) of FIG. 2 respectively illustrate current flows in a case where the output of the D-Class amplifier is "0".

The D-Class amplifier 2 carries out switching in accordance with the quantized signal, so as to switch over constant voltages to each other. This creates a high-voltage switching pulse corresponding to the quantized signal, so that the quantized signal is amplified. More specifically, the D-Class amplifier 2 can be constituted by a full-bridge circuit including four MOSFETs (metal-oxide semiconductor field effect transistor) Q1 through Q4, as illustrated in (a) of FIG. 2 through (d) of FIG. 2, for example. In each center of (a) of FIG. 2 through (d) of FIG. 2, a load 10, such as the speaker 11 (see FIG. 3), is illustrated, for the sake of simple explanation. In the D-Class amplifier 2, the MOSFETs Q1 and Q3 are connected to a constant voltage +V, and the MOSFETs Q2 and Q4 are connected to a constant voltage −V. Further, the MOSFETs Q1 and Q2 are provided on a + side with respect to the load 10, and the MOSFETs Q3 and Q4 are provided on a − side with respect to the load 10. The constant voltage −V may be set as a ground level.

For example, an output of the D-Class amplifier 2 is set to be "+1" for a case where the Q1 and Q4 are turned on, and simultaneously the Q2 and Q3 are turned off, and the output of the D-Class amplifier 2 is set to be "−1" for a case where the Q1 and Q4 are turned off, and simultaneously the Q2 and Q3 are turned on.

Further, in addition to the case of the binary signal indicating "+1" and "−1", it is also possible to have an arrangement employing a trinary signal by setting the output of the D-Class amplifier 2 to be "0" for a case where the Q1 and Q3 are turned off, and simultaneously the Q2 and Q4 are turned on. It is also possible to turn the Q1 and Q3 on and simultaneously turn the Q2 and Q4 off for the case where "0" is created in the D-Class amplifier 2. In a case where the quantizer 5 creates a binary signal, it is possible to use a half-bridge circuit in place of the full-bridge circuit. Moreover, the low-pass filter 3 smoothes the switching pulse outputted from the D-Class amplifier 2, so as to demodulate the switching pulse. Then, the low-pass filter 3 outputs an analogue signal thus prepared from the original audio signal. The subtractor 7 subtracts, from the original signal, the output signal (compensation signal) of the nonlinear compensation circuit 6, so as to create a difference signal.

It should be noted that it is possible that (i) the nonlinear compensation circuit 6 is set so as to output a signal whose sign is opposite to that of the signal set by the output signal (compensation signal) of the nonlinear compensation circuit 6, and (ii) an adder (adding means) is used in place of the subtractor (subtracting means) 7.

(Description as to Nonlinear Compensation Circuit)

Next, the following description explains a most important part of the present invention.

The nonlinear compensation circuit (compensation means) 6 includes a look-up table (storage means). In this look-up table, an association table, in which a plurality of original signals, and compensation values are individually associated with each other, is stored, so that the nonlinear compensation circuit 6 can output the compensation values accordingly. The following description deals with details of the compensation values stored in the look-up table.

Figure 3:
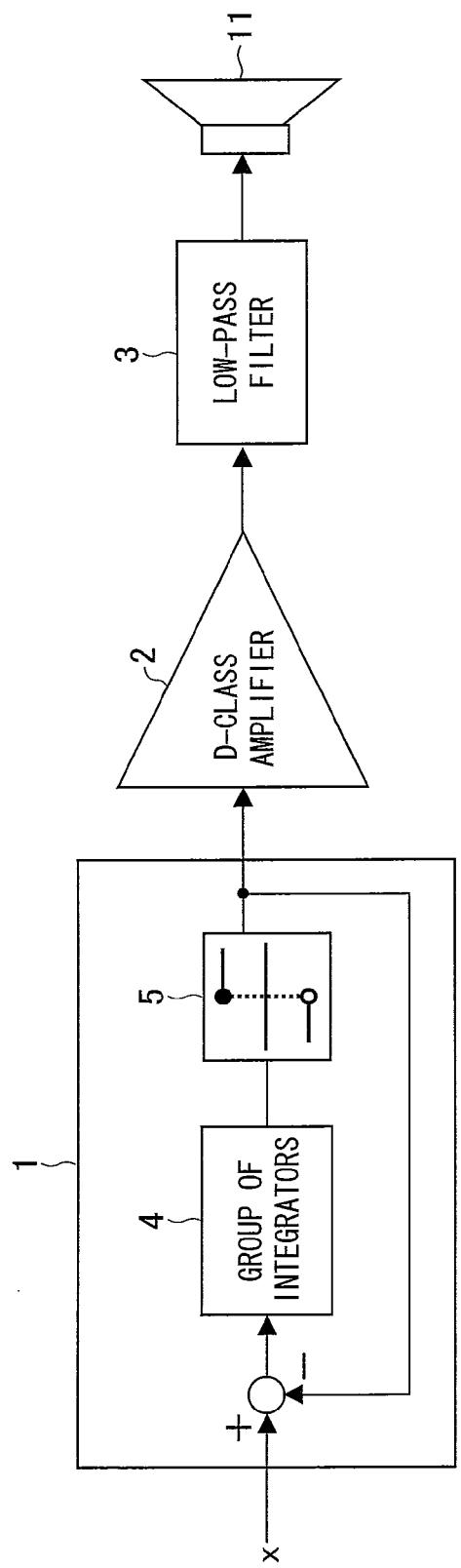
FIG. 3 is a block diagram partially illustrating the arrangement of FIG. 1.

FIG. 3 is a block diagram illustrating the $\Delta\Sigma$ modulation section 1, D-Class amplifier 2, and the low-pass filter 3, which are a part of the $\Delta\Sigma$ modulation digital-analogue converter illustrated in FIG. 1. In this diagram, the speaker 11 is illustrated in the downstream of the low-pass filter 3. Further, in this diagram, the quantizer 5 is arranged to create a binary signal. However, the arrangement is not limited to this, and the quantizer 5 may be arranged to create a trinary signal. Moreover, the speaker 11 is not particularly limited, and may be either another load, or an electroacoustic transducer which is connected to a plurality of speakers via an electric circuit network (i.e. network) constituted by passive elements (a coil, a capacitor, and a resistance).

Here, the D-Class amplifier 2 has a nonlinear characteristic. That is, there is a nonlinear relationship between an input toward the D-Class amplifier 2 and an output that the D-Class amplifier 2 outputs with respect to the input. Accordingly, the D-Class amplifier 2 outputs such a signal that distortion is added to the input. This causes a problem that faithful amplification cannot be carried out. In the description described above, the distortion is generated due to the nonlinear characteristic of the D-Class amplifier 2. However, not only the D-Class amplifier 2, but also the low-pass filter 3 has the nonlinear characteristic (not to an extent of the D-Class amplifier 2 though). This nonlinear characteristic of the low-pass filter 3 also increases the distortion.

Figure 4:
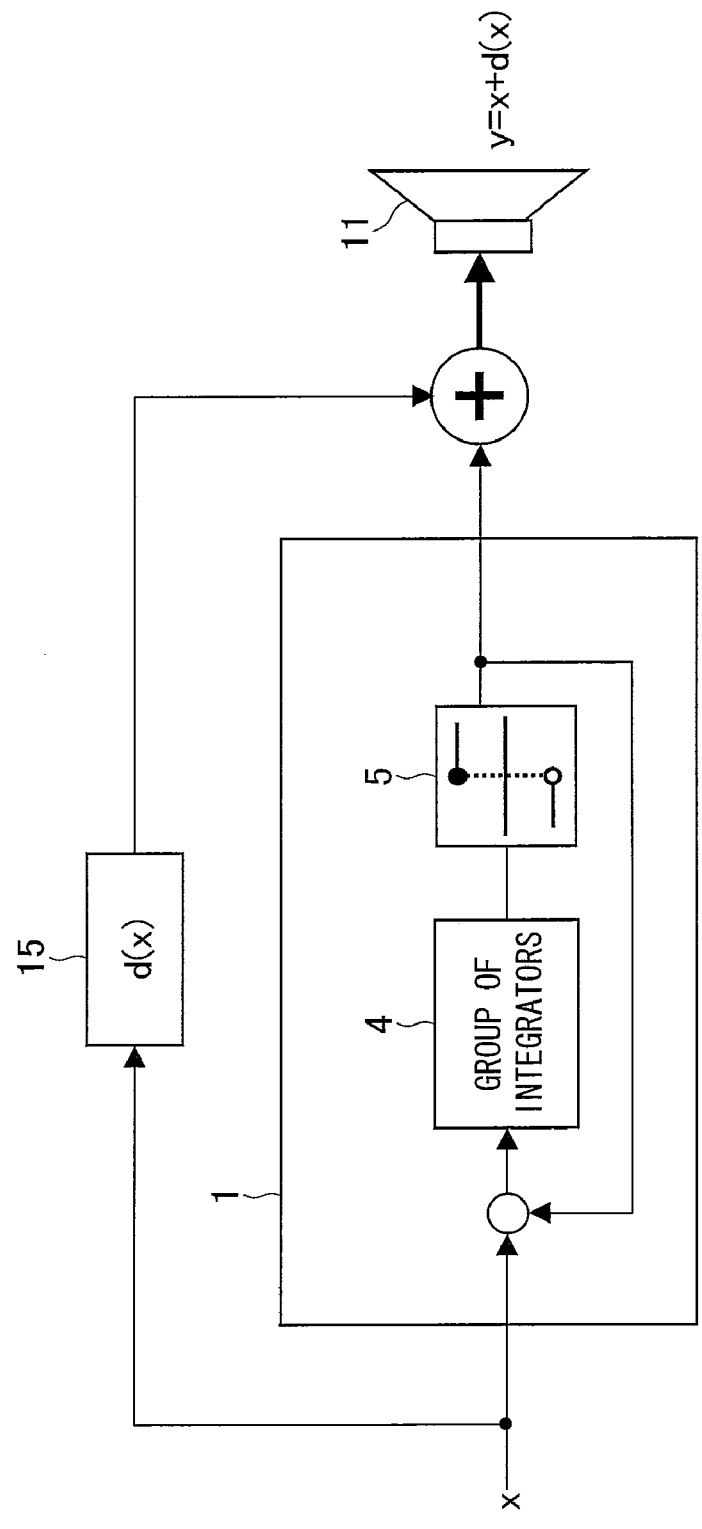
FIG. 4 is a model diagram showing a state where distortion factors due to a nonlinear characteristic is added in the configuration of FIG. 3.

There are various models for mathematically expressing a phenomenon of the generation of the distortion. Here, the following description explains a method of suppressing the distortion generated in the arrangement illustrated in FIG. 3, with reference to a model diagram (image diagram) of FIG. 4, which is an example of the easiest model of the generation of the distortion. Here, for easier explanation of a principle, it is supposed in the description that a gain from an input to an output is 1. In FIG. 4, the distortion generated in the output due to the nonlinear characteristic of the D-Class amplifier 2 illustrated in FIG. 3 is shown as a block of a distortion generating section (d(x)) 15. A distortion factor (i.e. a nonlinear function) that depends on an original signal x (an "input value of an input signal" recited in Claims), which is externally supplied, is added to the output of the quantizer 5. The inventors of the present invention found that, as illustrated in FIG. 4, the distortion generated due to the nonlinear characteristic of the D-Class amplifier 2 depends on the original signal x. If such a nonlinear function d(x) is added to the original signal x, a Fourier transform (frequency analysis) of the output of the $\Delta\Sigma$ modulation digital-analogue converter (i.e. an output of the low-pass filter 3) or of the output of the D-Class amplifier 2 generates odd-order harmonics. That is, the inventors of the present invention found that a model in which the odd-order harmonics are generated is the one to which the nonlinear function d(x) depending on a pulse density (depending on the original signal x) is newly added.

Particularly, the inventors of the present invention found that if an approximate value of such a nonlinear function d(x) that depends on the original signal x and is generated mainly due to the nonlinear characteristic of the D-Class amplifier 2, is subtracted from the original signal x in advance, that is, the approximate value is subtracted from the original signal x in the upstream of the $\Delta\Sigma$ conversion section 1, an influence of the distortion generated in the D-class amplifier 2 is minimized, whereby the original signal x, and the output of the $\Delta\Sigma$ modulation digital-analogue converter (or the output of the D-Class amplifier 2) show approximately a linear relationship. In other words, the inventors of the present invention found a technique of (i) creating a compensation function f(x) by estimating the characteristic of the nonlinear function d(x) of the D-Class amplifier 2 (or the low-pass filter 3), (ii) creating a nonlinear table (look-up table) in which the compensation function f(x) is stored, and (iii) subtracting data stored in the nonlinear table from the original signal x in advance.

Figure 5:
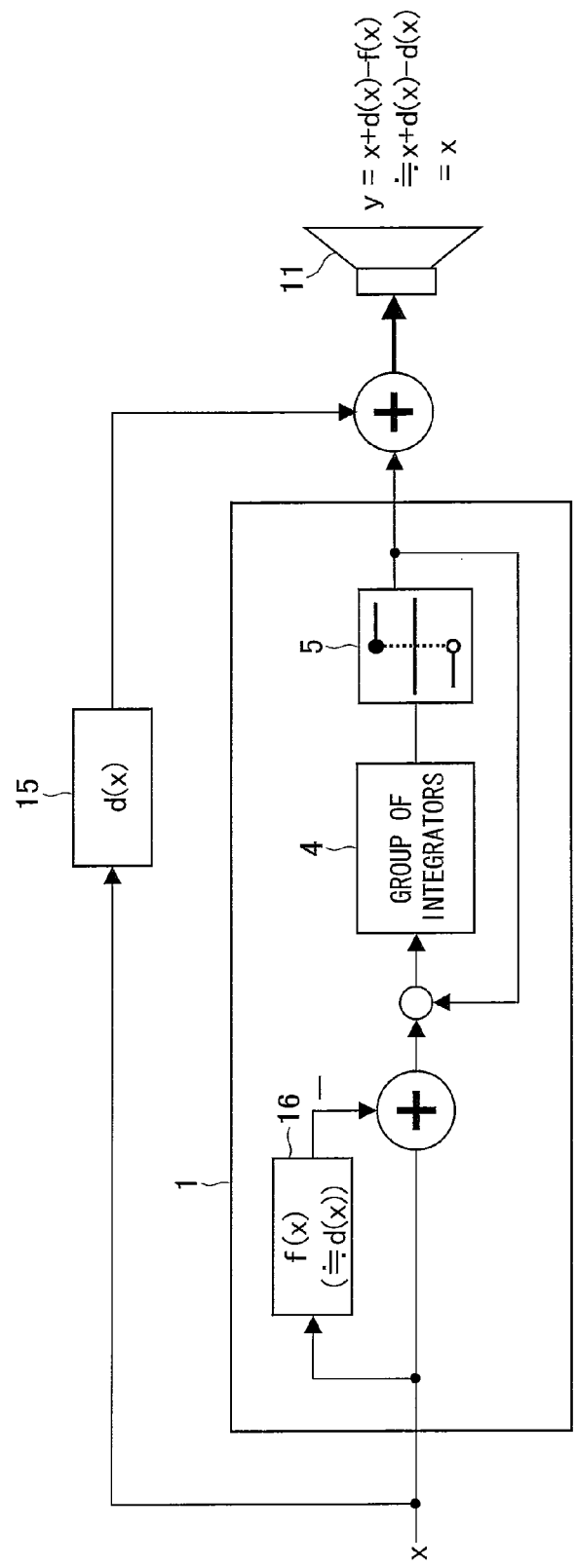
FIG. 5 is a model diagram schematically showing an arrangement in which the distortion factors illustrated in FIG. 4 are cancelled.

FIG. 5 is a view of such a model that the nonlinear table in which the compensation function f(x) is stored is added to the arrangement illustrated in FIG. 4. In FIG. 5, in addition to the model illustrated in FIG. 4, a block of a distortion compensation section 16 including the nonlinear table is provided. The group of integrators 4 receives such a signal that the compensation function f(x) outputted from the distortion compensation section 16 is subtracted from the original signal x. This makes it possible to subtract the compensation function f(x) from the nonlinear function d(x). Thereby, the influence of the distortion generated due to the nonlinear characteristic of the D-Class amplifier 2 can be minimized. Accordingly, it becomes possible to suppress the odd-order harmonics of a power spectrum that is obtained in such a manner that the output of the D-Class amplifier 2 or the output of the ΔΣ modulation digital-analogue converter is subjected to the Fourier transform.

(Principle of Generation of Odd-Order Harmonics)

Here, the following description explains a principle of the generation of the odd-order harmonics, which the present invention suppresses.

Figure 6:
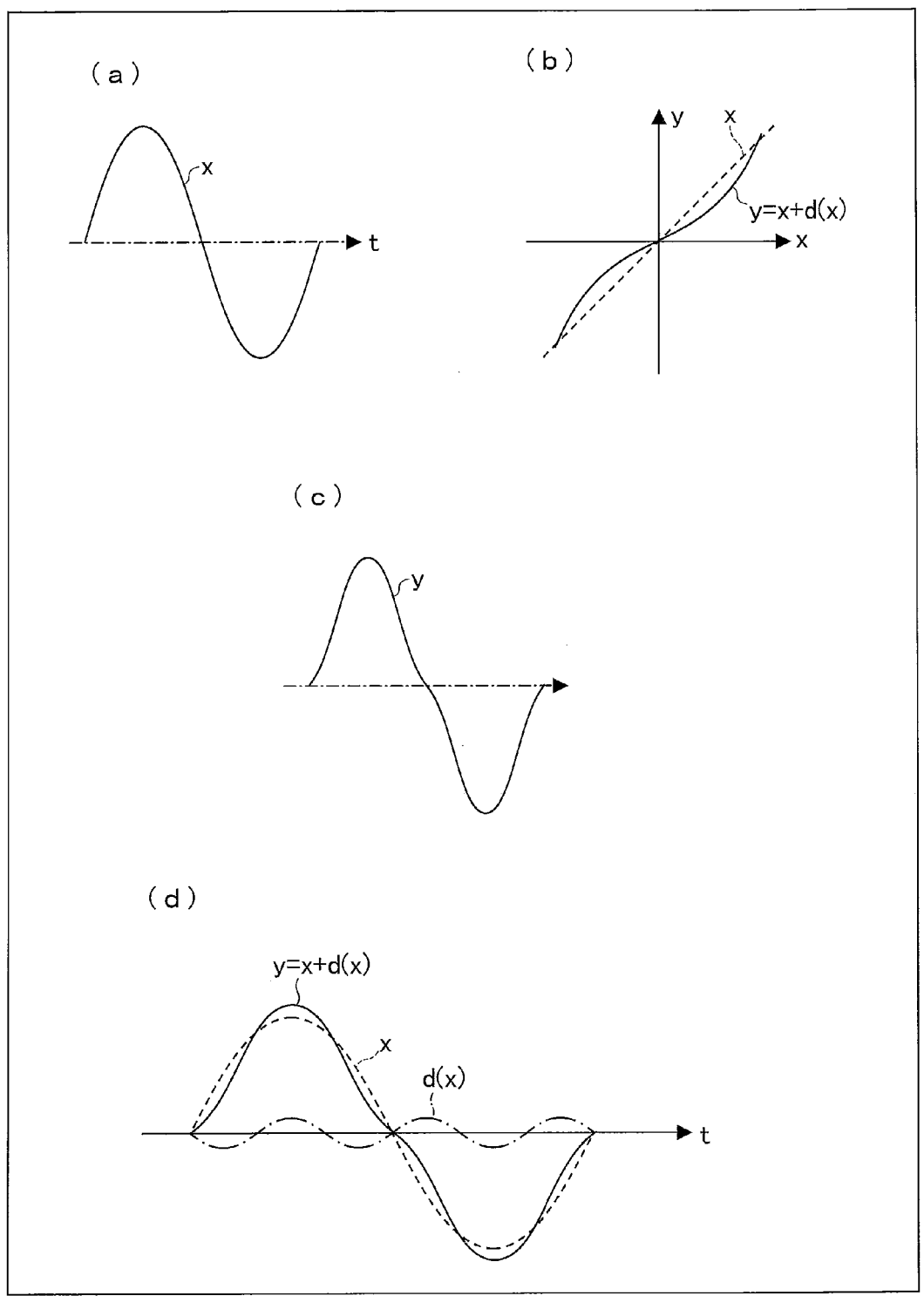
FIG. 6 is a view illustrating waveforms, and (a) of FIG. 6 shows a sine wave, (b) of FIG. 6 shows a nonlinear characteristic of a switching amplifier or a nonlinear characteristic of a low-pass filter, (c) of FIG. 6 shows a waveform of an output signal corresponding to the sine wave, and (d) of FIG. 6 shows (i) the sine wave, (ii) a harmonic distortion waveform whose frequency is approximately three times that of the sine wave, and (iii) a combined waveform of the sine wave and the harmonic distortion waveform.

For example, a certain sine wave, as shown in (a) of FIG. 6, is inputted as the original signal x. If the original signal x is passed through the D-Class amplifier 2 or the low-pass filter 3, both of which have the nonlinear characteristic as indicated by "y=x+d(x)" in (b) of FIG. 6, the nonlinear characteristic function d(x) is added to the original signal x. Therefore, as illustrated in (c) of FIG. 6, the distortion is generated in the output signal y of the D-Class amplifier 2 (or the output signal y of the ΔΣ modulation digital-analogue converter). That is, the output signal y becomes such a waveform that the sine wave of the original signal x is thinned.

(b) of FIG. 6 is a view showing the nonlinear characteristic of the D-Class amplifier 2 and the low-pass filter 3. In (b) of FIG. 6, a dashed line indicates a waveform showing "y=x" (an ideal waveform showing a linear characteristic), and a full line indicates a waveform showing "y=x+d(x)" (a waveform showing a nonlinear characteristic).

(d) of FIG. 6 is a view showing waveforms of the output signal y, the original signal x, and the nonlinear function d(x). Here, as an example, (d) of FIG. 6 shows a nonlinear function d(x) of a third-order harmonic having a frequency three times that of a fundamental harmonic in a case where a waveform measured as the waveform of the original signal x is provided as the fundamental harmonic (first-order harmonic).

Figure 7:
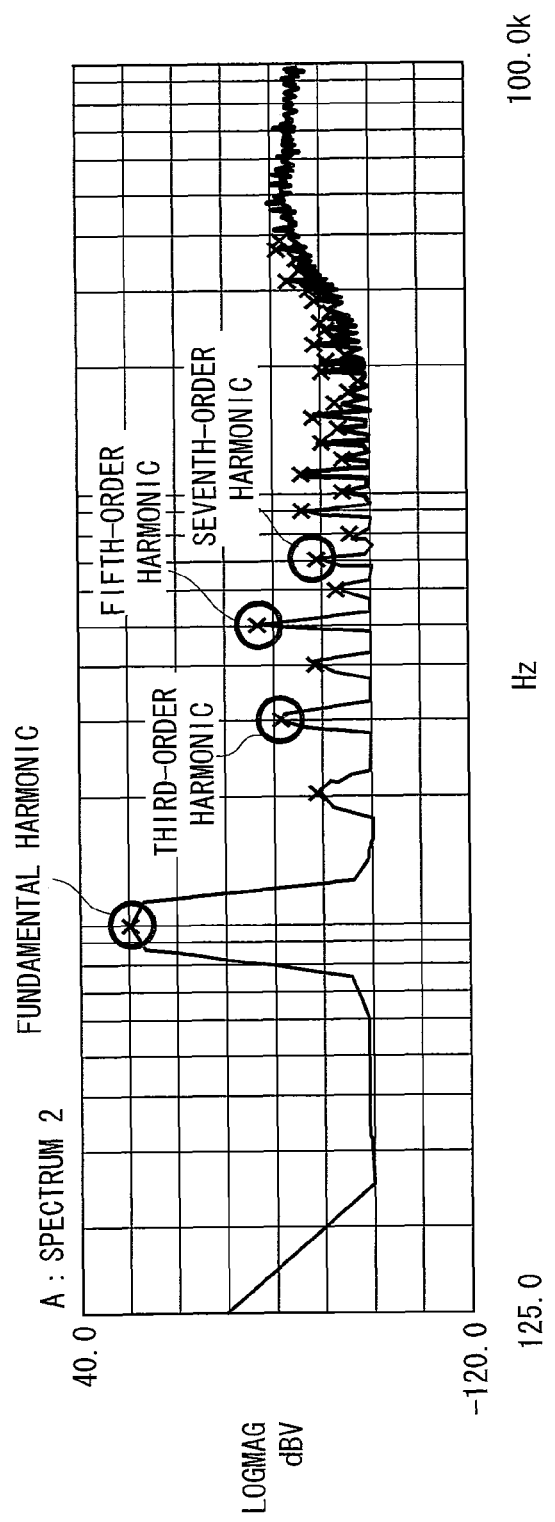
FIG. 7 is a power spectrum (frequency spectrum) waveform of an output of a switching amplifier, which output was subjected to a frequency-analysis when a look-up table of the present embodiment is determined.

If, the output signal y of the D-Class amplifier 2 (or the output signal y of the ΔΣ modulation digital-analogue converter) is subjected to the Fourier transform (i.e. the frequency analysis), odd-order harmonics which have frequencies three times, five times, seven times . . . more than that of the fundamental harmonic, respectively, are generated as the distortion, due to the nonlinear function d(x), as shown in FIG. 7. In other words, a frequency spectrum shows large values at frequencies A times (A is an odd number) that of the fundamental harmonic. In FIG. 7, a longitudinal axis indicates a magnitude of the frequency spectrum, and a lateral axis indicates the frequency.

This is the principle of the generation of the odd-order harmonics.

The following description explains how a value to be subtracted from the original signal x is determined in the upstream of the ΔΣ modulation section 1, that is, how data (compensation function f(x); compensation value) to be stored in the look-up table in the nonlinear compensation circuit 6 is determined.

(First Method of Working Out Compensation Value)

As shown in (b) of FIG. 6, due to the nonlinear characteristic of the D-Class amplifier 2 and low-pass filter 3, a nonlinear relationship is generated between the original signal x, and the output signal y of the D-Class amplifier (or the output signal y of the ΔΣ modulation digital-analogue converter).

That is, it can be put that the following relationship is established between the original signal x and the output signal y, for example.

$$y = Gx + d(x) \quad \text{(Formula 1)}$$

In the formula, "G" is an amplification ratio ($a_1/a_s$, which will be described later) in the amplification carried out in the D-Class amplifier 2. Here, the nonlinear function d(x) is a cause of the nonlinear characteristic. A point of the present invention is how to suppress the d(x).

Here, in a case where a sine wave having an amplitude value $a_s$ is supplied as the original signal x, for example, the odd-order harmonics are generated in the output signal y due to the nonlinear characteristic of the D-class amplifier 2 and the nonlinear characteristic of the low-pass filter 3, that is, the nonlinear function d(x). As a result, the original signal x and the output signal y become as represented by the following Formula 3.

$$x = a_s \sin(\omega t) \quad \text{(Formula 2)}$$

$$y = a_1 \sin(\omega t) + a_3 \sin(3\omega t) + a_5 \sin(5\omega t) + a_7 \sin(7\omega t) + \Lambda \quad \text{(Formula 3)}$$

Here, "$a_1 \sin(\omega t)$" corresponds to "Gx" of Formula 1, and "$a_3 \sin(3\omega t) + a_5 \sin(5\omega t) + a_7 \sin(7\omega t) + \Lambda$" corresponds to "f(x)" of Formula 1. The amplitude value $a_s$ is a magnitude of an amplitude value of the sine wave (fundamental harmonic) of the original signal x that is externally supplied, and the amplitude value $a_1$ is a magnitude of an amplitude value of a signal having a frequency (which has been actually measured by use of a spectrum analyzer) equal to that of the fundamental harmonic. The amplitude value $a_3$ is a magnitude of an amplitude value of a signal having a frequency (which has been also actually measured by use of the spectrum analyzer) three times that of the fundamental harmonic.

From Formula 2, the following formula can be obtained.

$$x/a_s = a_1 \sin(\omega t) \quad \text{(Formula 4)}$$

Further, it is possible to convert Formula 4 into the following formula.

$$\omega t = \sin^{-1}(x/a_s) \quad \text{(Formula 5)}$$

By substituting Formula 5 in Formula 3, the following Formula 6 can be obtained.

$$y = \frac{a_1}{a_s} x + a_3 \sin\left(3\sin^{-1}\left(\frac{x}{a_s}\right)\right) + a_5 \sin\left(5\sin^{-1}\left(\frac{x}{a_s}\right)\right) + a_7 \sin\left(7\sin^{-1}\left(\frac{x}{a_s}\right)\right) + \Lambda \quad \text{(Formula 6)}$$

The inventors of the present invention found that a relationship between the output signal y and the original signal x can show approximately a linear relationship if (i) such a value (compensation value) that the value of the output signal y depends on the original signal x, and the value can cancel a part except "$(a_1/a_s)x$" on the right side of Formula 6 (i.e. a d(x) component) as much as possible, is determined, and (ii) the value is subtracted from the original signal x. In other words, the inventors of the present invention found that the d(x) component in Formulas 3 and 6 breaks the linear relationship between the original signal x and the output signal y, and should be cancelled. The following description explains how to determine the compensation value for working out the d(x) component.

Here, the following formula represents an ideal output signal y' supposing that the d(x) component is cancelled in the output signal y.

$$y' = (a_1/a_s)x \quad \text{(Formula 7)}$$

This Formula 7 is such a formula that the d(x) component is merely cancelled in Formula 6. If the output signal y becomes as shown in Formula 7, the relationship between the output signal y and the original signal x will show approximately the linear relationship.

Further, Formula 7 can be represented by the following formula.

$$y' = \frac{a_1}{a_s}x = \frac{a_1}{a_s}x + a_3\sin\left(3\sin^{-1}\left(\frac{x}{a_s}\right)\right) + a_5\sin\left(5\sin^{-1}\left(\frac{x}{a_s}\right)\right) + \quad \text{(Formula 8)}$$
$$a_7\sin\left(7\sin^{-1}\left(\frac{x}{a_s}\right)\right) + \Lambda - a_3\sin\left(3\sin^{-1}\left(\frac{x}{a_s}\right)\right) -$$
$$a_5\sin\left(5\sin^{-1}\left(\frac{x}{a_s}\right)\right) - a_7\sin\left(7\sin^{-1}\left(\frac{x}{a_s}\right)\right) - \Lambda$$

This Formula 8 can be obtained from Formula 7 by replacing the d(x) component in Formula 6 with "$+d(x)-d(x)$".

Next, Formula 8 is converted into the following Formula 9.

$$y' = \frac{a_1}{a_s}\left\{x - \frac{a_s a_3}{a_1}\sin\left(3\sin^{-1}\left(\frac{x}{a_s}\right)\right) - \frac{a_s a_5}{a_1}\sin\left(5\sin^{-1}\left(\frac{x}{a_s}\right)\right) - \right. \quad \text{(Formula 9)}$$
$$\left.\frac{a_s a_7}{a_1}\sin\left(7\sin^{-1}\left(\frac{x}{a_s}\right)\right) - \Lambda\right\} + a_3\sin\left(3\sin^{-1}\left(\frac{x}{a_s}\right)\right) +$$
$$a_5\sin\left(5\sin^{-1}\left(\frac{x}{a_s}\right)\right) + a_7\sin\left(7\sin^{-1}\left(\frac{x}{a_s}\right)\right) + \Lambda$$

Here, by replacing $\{\ldots\}$ with x', Formula 9 is converted into the following formula.

$$x' = x - \frac{a_s a_3}{a_1}\sin\left(3\sin^{-1}\left(\frac{x}{a_s}\right)\right) - \quad \text{(Formula 10)}$$
$$\frac{a_s a_5}{a_1}\sin\left(5\sin^{-1}\left(\frac{x}{a_s}\right)\right) - \frac{a_s a_7}{a_1}\sin\left(7\sin^{-1}\left(\frac{x}{a_s}\right)\right) - \Lambda$$

This Formula 10 is converted into the following Formula 11.

$$x' = x - f(x) \quad \text{(Formula 11)}$$

Then, the original signal x is compensated into the x', and an output of the x' is checked. As a result, it is possible to create the output signal y' which is the output signal y in which the d(x) component is cancelled as much as possible.

In other words, if the compensation function f(x) is set to be the compensation value shown in the following Formula 12, it becomes possible to create the output signal y' in which the d(x) component generated due to the nonlinear characteristic of the D-Class amplifier 2 and the low-pass filter 3 is cancelled as much as possible.

$$f(x) = \frac{a_s a_3}{a_1}\sin\left(3\sin^{-1}\left(\frac{x}{a_s}\right)\right) + \quad \text{(Formula 12)}$$
$$\frac{a_s a_5}{a_1}\sin\left(5\sin^{-1}\left(\frac{x}{a_s}\right)\right) + \frac{a_s a_7}{a_1}\sin\left(7\sin^{-1}\left(\frac{x}{a_s}\right)\right) + \Lambda$$

Next, the following description specifically explains a procedure of determining a value of the compensation function f(x) by referring to the correspondence relationship between the original signal x and the compensation function f(x), which value will be stored in the look-up table. First, the output of the nonlinear compensation circuit 6 is set to be 0, and the sine wave having the amplitude value $a_s$ is supplied as the original signal x. Here, a dB value of the amplitude value $a_s$ is $A_s$.

Next, the output of the D-Class amplifier 2 is measured, and an actual spectrum is measured by use of the spectrum analyzer. With this procedure, a fundamental harmonic $|a_1|$ ($A_1[dB]$), and odd-order harmonics (a third-order harmonic $|a_3|(A_3[dB])$, a fifth-order harmonic $|a_5|(A_5[dB])$, ... ) are determined.

Then, it is determined which state the fundamental harmonic, and the odd-order harmonics (the third-order harmonic, the fifth-order harmonic ... ) belong to, that is, (1) a state where a phase of the fundamental harmonic, and phases of the odd-order harmonics (the third-order harmonic, the fifth-order harmonic ... ) have in-phase components, (2) a state where the phase of the fundamental harmonic, and the phases of the odd-order harmonics (the third-order harmonic, the fifth-order harmonic ... ) have out-of-phase components, or (3) a state where the phase of the fundamental harmonic, and the phases of the odd-order harmonics (the third-order harmonic, the fifth-order harmonic ... ) have neither the in-phase components nor the out-of-phase components.

Figure 8:
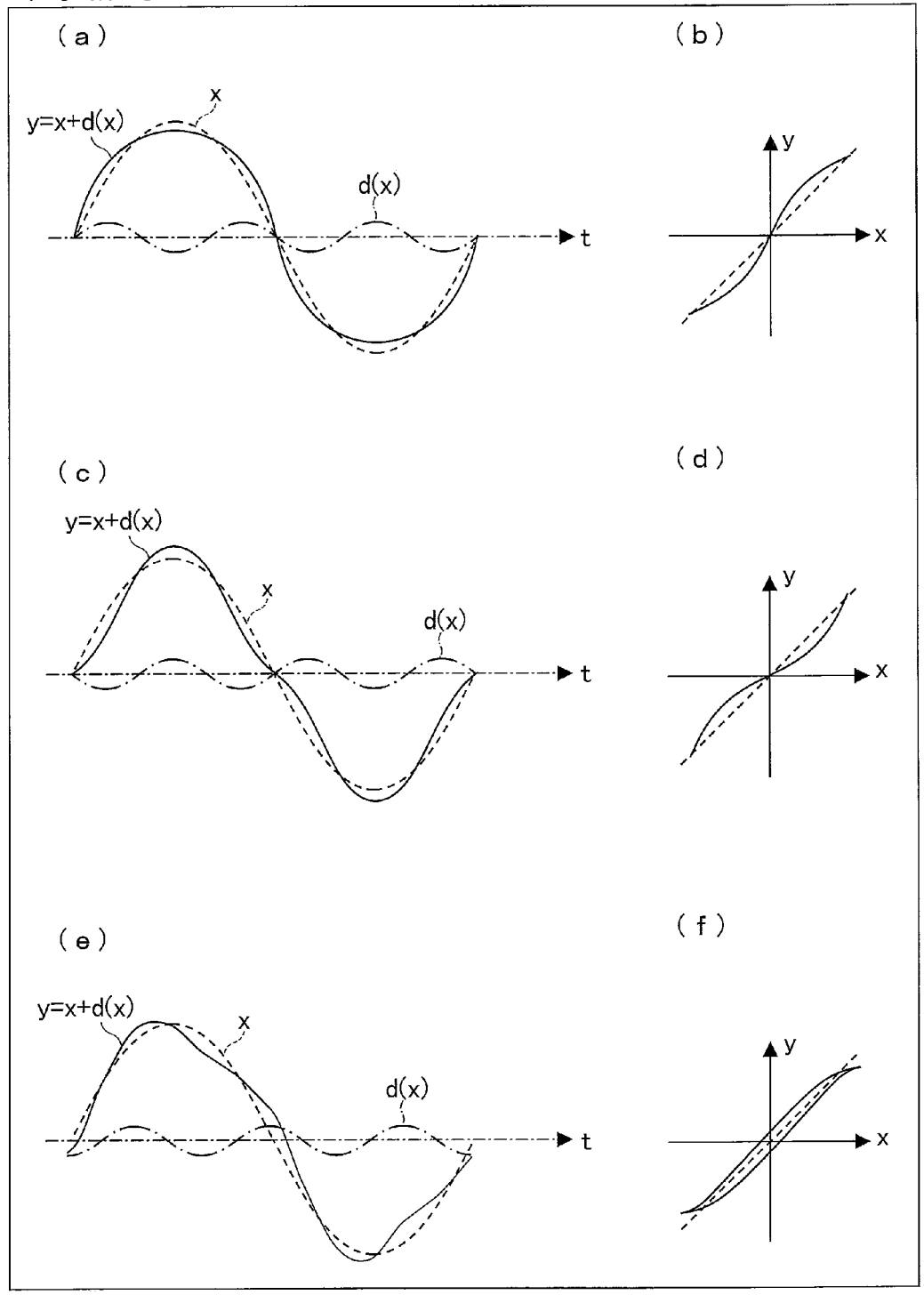
FIG. 8 is a view illustrating waveforms, and (a) of FIG. 8 corresponds to (d) of FIG. 6 in a case where a third-order harmonic and a fundamental harmonic (first-order harmonic) are in phase, (b) of FIG. 8 corresponds to (b) of FIG. 6 in a case where the third-order harmonic and the fundamental harmonic (first-order harmonic) are in phase, (c) of FIG. 8 corresponds to (d) of FIG. 6 in a case where the third-order harmonic and the fundamental harmonic (first-order harmonic) are out of phase, (d) of FIG. 8 corresponds to (b) of FIG. 6 in a case where the third-order harmonic and the fundamental harmonic (first-order harmonic) are out of phase, (e) of FIG. 8 corresponds to (d) of FIG. 6 in a case where the third-order harmonic and the fundamental harmonic (first-order harmonic) are neither in phase nor out of phase, and (f) of FIG. 8 corresponds to (b) of FIG. 6 in a case where the third-order harmonic and the fundamental harmonic (first harmonic) are neither in phase nor out of phase.

Here, "the state where the phase of the fundamental harmonic, and the phases of the odd-order harmonics (the third-order harmonic, the fifth-order harmonic ... ) have in-phase components" means a case where the nonlinear characteristic of the D-Class amplifier 2 and of the low-pass filter 3 is shown in an S-shaped curve, as shown in (b) of FIG. 8. In this case, as shown in (a) of FIG. 8, the original signal x and the nonlinear function d(x) are substantially in phase.

Further, "the state where the phase of the fundamental harmonic, and the phases of the odd-order harmonics (the third-order harmonic, the fifth-order harmonic ... ) have out-of-phase components" means a case where the nonlinear characteristic of the D-Class amplifier 2 and of the low-pass filter 3 is shown in a reversed S-shaped curve, as shown in (d) of FIG. 8. In this case, as shown in (c) of FIG. 8, the original signal x and the nonlinear function f(x) are substantially in phase.

Furthermore, "the state where the phase of the fundamental harmonic, and the phases of the odd-order harmonics (the third-order harmonic, the fifth-order harmonic ... ) have neither the in-phase components nor the out-of-phase components" means a case where the nonlinear characteristic of the D-Class amplifier 2 and of the low-pass filter 3 is shown in a hysteresis loop shape, as shown in (f) of FIG. 8. In this case, as shown in (e) of FIG. 8, the original signal x and the nonlinear function f(x) are neither in phase nor out of phase.

Based on this fact, the relationships between the phase of the fundamental harmonic, and the phases of the odd-order harmonics (the third-order harmonic, the fifth-order harmonic ... ) are actually examined. Depending on a result of the determination, that is, depending on which relationship the fundamental harmonic and the odd-order harmonics actually have, it is determined whether $a_3$, $a_5$, and $a_7$ in the aforementioned Formula 12 have positive or negative signs. More specifically, if the phase of the fundamental harmonic and the phases of the odd-order harmonics have the in-phase components, the signs will be "positive", and if these have the out-of-phase components, the signs will be "negative".

With the method described above, it becomes possible to work out the compensation function f(x) (i.e. the compensation value). By providing the look-up table in which a correspondence table in which the compensation values thus worked out are associated respectively with the original signals is stored in advance, it becomes possible to suppress the odd-order harmonics generated in the output due to the nonlinear characteristic of the D-Class amplifier 2 and of the low-pass filter 3.

Figure 15:
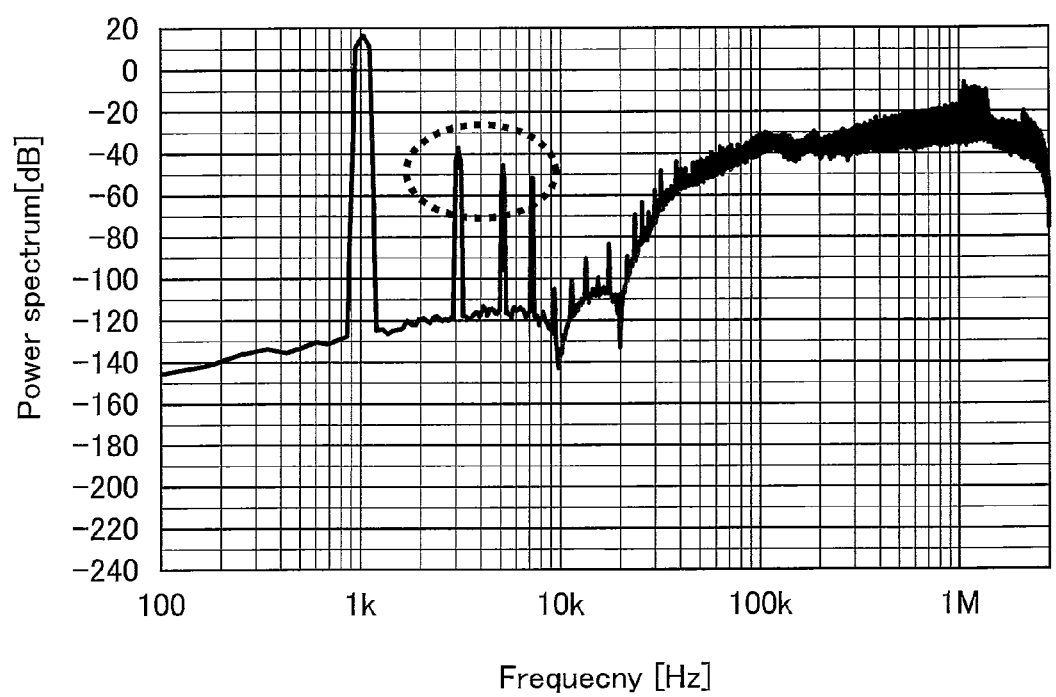
FIG. 15 is a view of a waveform measured in such a manner that an output of a conventional $\Delta\Sigma$ modulation digital-analogue converter is subjected to a frequency-analysis, and then is measured by use of a spectrum analyzer.

FIG. 11 is a view of a waveform, showing that the odd-order harmonics were actually suppressed with the use of the nonlinear compensation circuit 6 of the present embodiment. More specifically, FIG. 11 shows a frequency spectrum which can be obtained in such a manner that the output signal of the ΔΣ modulation digital-analogue converter or the output signal of the D-Class amplifier 2 is subjected to the frequency analysis. The spectrum in the vicinity of 1 kHz shows a signal component of an amplified fundamental harmonic (sine wave). By comparing FIG. 11 with the aforementioned FIG. 15, it can be clearly seen that the odd-order harmonics are suppressed.

In the above description, the odd-order harmonics are generated due to the nonlinear characteristic of both the D-Class amplifier 2 and the low-pass filter 3. Since the odd-order harmonics are mainly generated due to the nonlinear characteristic of the D-Class amplifier 2, it is possible to set the compensation value to suppress only the odd-order harmonics generated due to the nonlinear characteristic of the D-class amplifier 2. Alternatively, it is also possible to set the compensation value to suppress the odd-order harmonics generated due to the nonlinear characteristic of both the D-Class amplifier 2 and the low-pass filter 3.

More specifically, in the above procedure, if the output of the D-Class amplifier 2 is subjected to the frequency analysis, it becomes possible to suppress the odd-order harmonics generated due to only the nonlinear characteristic of the D-Class amplifier 2. Alternatively, if the output of the low-pass filter 3, that is, the output of the ΔΣ modulation digital-analogue converter, is subjected to the frequency analysis, it becomes possible to suppress the odd-order harmonics generated due to the nonlinear characteristic of both the D-Class amplifier 2 and the low-pass filter 3.

(Second Method of Working Out Compensation Value)

The method of working out the compensation function f(x), that is, the compensation value, is not limited to the aforementioned first method, and the compensation value may be worked out by the following method.

First, the output of the nonlinear compensation circuit 6 is set to be 0. Then, as shown in FIG. 9, a plurality of output signals y(t) of the D-Class amplifier 2 (or the ΔΣ modulation digital-analogue converter) are measured at the time an original signal x(t) is inputted at a certain time t, so that a plurality of combinations of the x(t) and y(t) (i.e. a plurality of x-y coordinates) are determined. For example, N coordinates, that is, $x_i$(i=1, 2, ..., N; N is an integer not less than 3), and $y_i$(i=1, 2, ..., N; N is an integer not less than 3) are obtained. Note that the N may be any integer as long as the integer is not less than 3. The reason why it is necessary to measure not less than 3 coordinates is that a measurement of two coordinates provides only information of a straight line. Such information does not include the information that can be used for the compensation (information of a difference between the output y and the straight line).

Next, a and b that minimize the following formula are calculated by a least-square method.

$$E = \Sigma_{i=1}^{N}\{(ax_i+b)-y_i\}^2 \quad \text{(Formula 13)}$$

This makes it possible to determine, by the following Formula 14, the a and b which are factors of an equation of a straight line approximating a relationship between $x_i$ and $y_i$. FIG. 10 is such a view that the following Formula 14 is added to FIG. 9.

$$y = ax+b \quad \text{(Formula 14)}$$

The following formula shows $f(x_i)$ which is an error between the straight line shown by the above Formula 14 and an actual input-output curve that is formed in such a manner that the coordinates measured as described above are connected to each other.

$$f(x_i) = y_i - (ax_i+b) \quad \text{(Formula 15)}$$

This $f(x_i)$ may be stored in the look-up table described above as the compensation function, that is, the compensation value.

An object of the method is, as described above, to suppress the harmonics by linearizing the relationship between the input and output of the ΔΣ modulation (that is, to cause the output y of the ΔΣ modulation to be close to the equation of the straight line of "ax+b"). Originally, the $x_i$ and $y_i$ are data of a result of "distortion" due to a digital amplifier. Further, the following description deals with a proof that the linear characteristic can be realized by this method.

(Proof)

Relationship before the compensation is carried out:

$$y_i = x_i + d(x_i)$$

Compensation formula obtained by the least square method:

$$f(x_i) = y_i - (ax_i+b)$$

Relationship after the compensation is carried out:

$$y'_i = x_i + d(x_i) - f(x_i)$$

Error E' with respect to the straight line after the compensation is carried out:

$$\begin{aligned}E' &= \Sigma((ax_i+b)-y'_i)^2 \\ &= \Sigma((ax_i+b)-x_i-d(x_i)+f(x_i))^2 \\ &= \Sigma((ax_i+b)-x_i-d(x_i)+y_i-(ax_i+b))^2 \\ &= \Sigma(-x_i-d(x_i)+y_i)^2\end{aligned}$$

Here, "E'=0" results from "$-x_i-d(x_i)+y_i=0$" in a relational expression prior to the compensation. In other words, since the error with respect to the straight line is 0, the outputs of the xi and yi retain the linear characteristic, after the compensation is carried out.

(Another Arrangement of ΔΣ Modulation Digital-Analogue Converter)

In the above first and second methods of working out the compensation value, the compensation functions (compensation values) have been determined by experiments, and stored in the look-up table in advance. That is, the look-up table has been provided in the nonlinear compensation circuit 6. However, the present invention is not limited to the arrangement, and the nonlinear compensation circuit 6 may be provided with the following calculation circuit (calculation means). The calculation circuit is arranged to (i) receive an output signal from the D-Class amplifier 2 or the ΔΣ modulation digital-analogue converter, (ii) compare the output signal with an original signal, and (iii) calculate out a compensation function (compensation value) for each output signal.

Further, with the first and second methods of working out the compensation value, the subtractor 7 is provided on a route from an end to which the original signal x is inputted to the ΔΣ modulation section 1, and a difference signal, which has been obtained in such a manner that the output signal of the nonlinear compensation circuit 6 is subtracted from the original signal, is inputted into the ΔΣ modulation section 1. However, the present invention is not limited to the arrangement.

Figure 12:
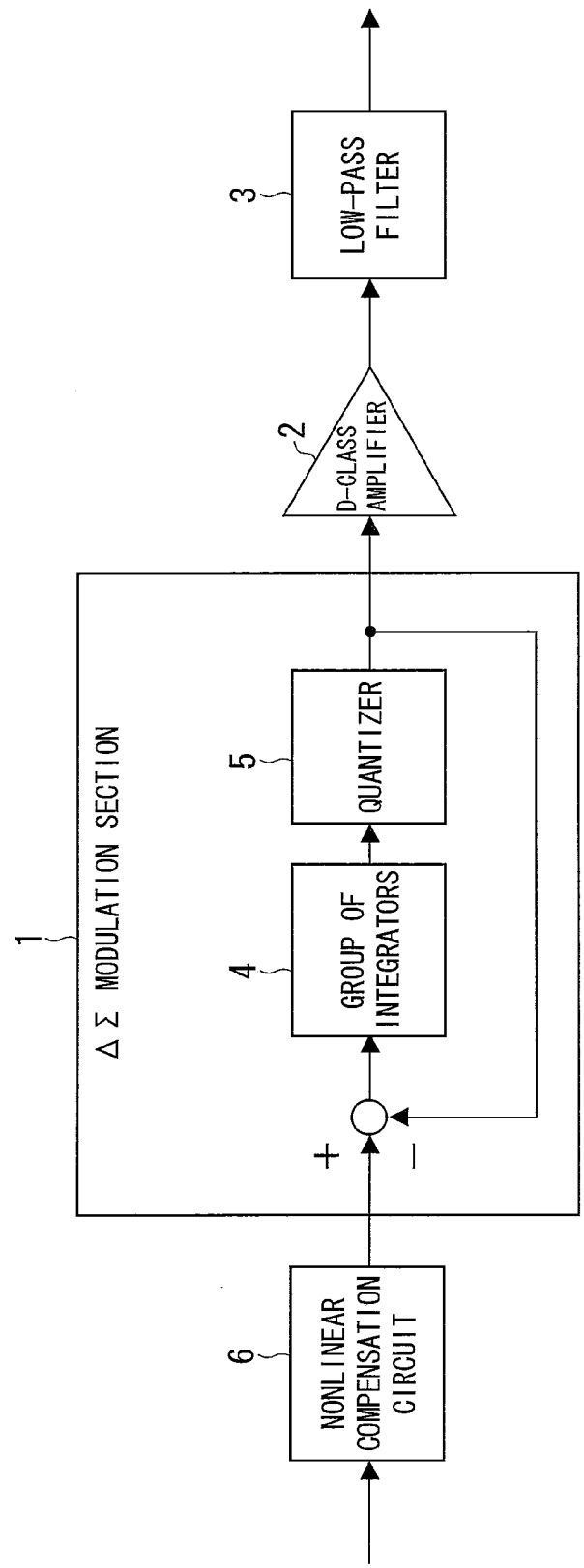
FIG. 12 is a block diagram of a modified example of FIG. 1, illustrating the $\Delta\Sigma$ modulation digital-analogue converter of the present embodiment.
Figure 13:
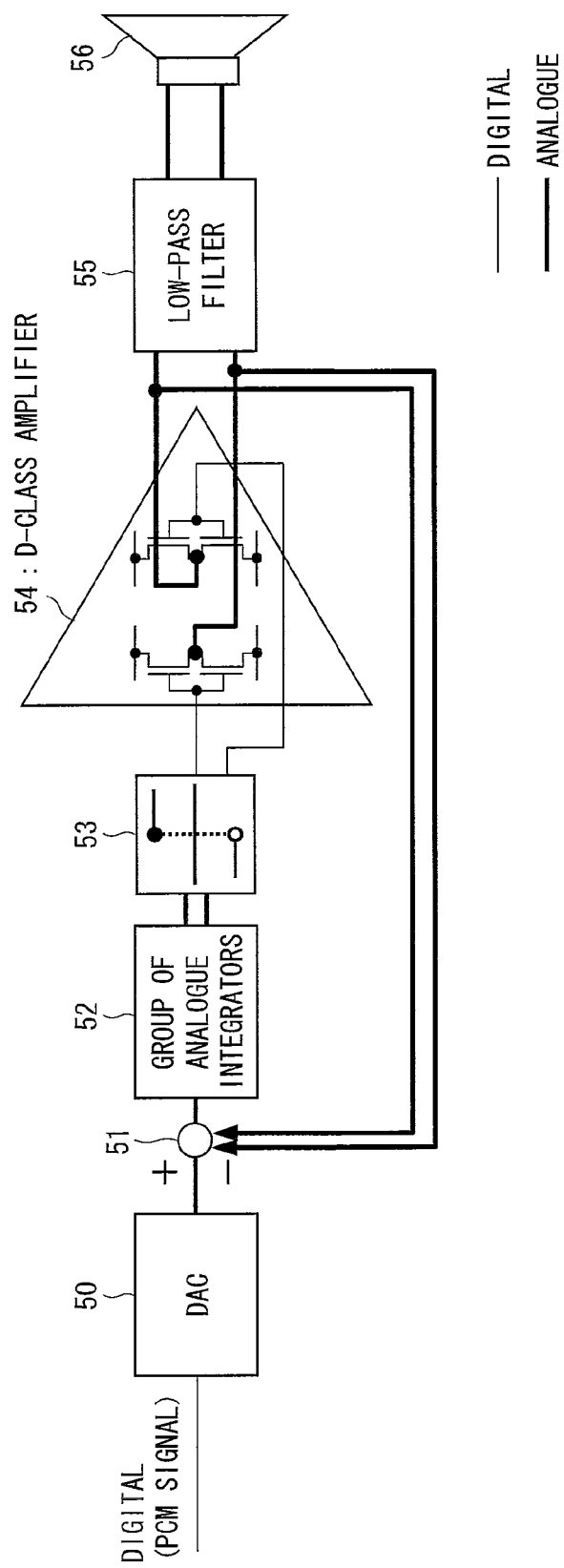
FIG. 13 is a block diagram illustrating a conventional A modulation digital-analogue converter.
Figure 14:
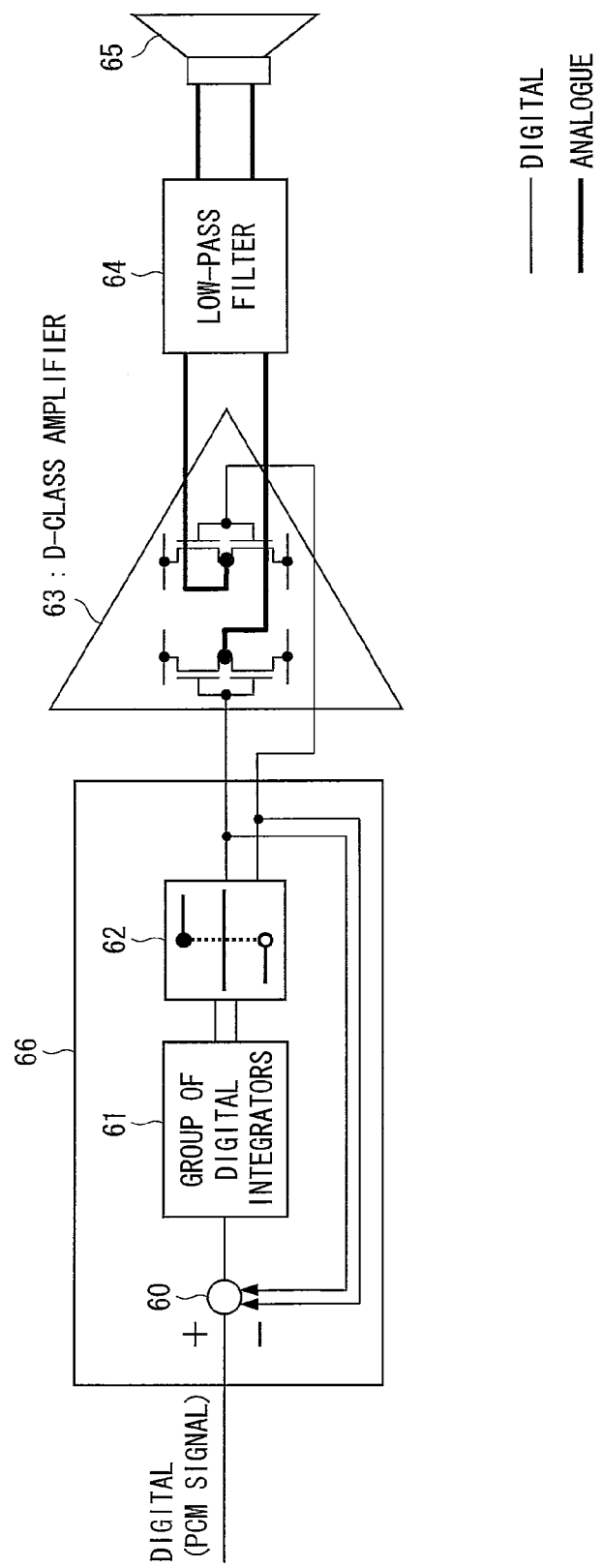
FIG. 14 is a block diagram illustrating another conventional $\Delta\Sigma$ modulation digital-analogue converter.

As illustrated in FIG. 12, the ΔΣ modulation digital-analogue converter of the present embodiment may be arranged such that the subtractor 7 is removed from the arrangement illustrated in FIG. 1, and the nonlinear compensation circuit 6 is provided on the route from the end to which the original signal x is inputted to the ΔΣ modulation section 1.

However, in the case of the first method of working out the compensation value, it is necessary to store, in the look-up table, not data in which x and f(x) are associated with each other, but data in which x and x'(=x−f(x)) are associated with each other. That is, the nonlinear compensation circuit 6 is arranged to include a look-up table that outputs x−f(x) with respect to the input x.

Further, in the case of the second method of working out the compensation value, it is necessary to store, in the look-up table, not data in which $x_i$ and $d(x_i)$ are associated with each other as described above, but data in which $x_i$ and $x_i'(=x_i-d(x_i))$ are associated with each other. In other words, the nonlinear compensation circuit 6 is arranged to include a look-up table that outputs $x_i-d(x_i)$ with respect to the input x.

Furthermore, the second method of working out the compensation value may be modified as described below. That is, since the relationship between the output y and the input x only has to be "y=ax+b", (i) first, the nonlinear compensation circuit 6 of the present embodiment may be removed so as to allow the ΔΣ modulation to directly receive the input, and (ii) when a certain x is determined, an input x' of the ΔΣ modulation is determined so that "y(=ax+b)" is satisfied. Then, the nonlinear compensation circuit 6 may be provided to carry out the compensation so that the input is the x' obtained from the correspondence relationship between x and x'.

Further, the ΔΣ modulation digital-analogue converter of the present invention may be expressed such that a ΔΣ modulation digital-analogue converter for converting a quantized signal received from ΔΣ modulation means into an analogue signal, includes: a nonlinear compensation circuit for outputting a compensation signal in accordance with a supplied input signal; adding means for adding the compensation signal to the supplied input signal; and the ΔΣ modulation means for modulating an output of the adding means into the quantized signal; wherein an output value of the nonlinear compensation circuit is calculated out from a harmonic distortion component of a power spectrum of an output of the ΔΣ modulation digital-analogue converter, the harmonic distortion component being obtained in a case where (i) a sine wave having a single frequency is supplied to an input of the ΔΣ modulation digital-analogue converter, and (ii) the output of the nonlinear compensation circuit is set to be 0. Alternatively, the nonlinear compensation circuit may determine a compensation value in such a manner that (i) a value of an output y is measured when an input x is supplied, and (ii) the compensation value is determined from a correspondence relationship between the input x and the output y.

Further, the present invention includes a nonlinear compensation circuit, an adder, a ΔΣ modulator, an SW amplifier, and a low-pass filter, and in order to calculate a value of a compensation table, (i) the value of the compensation table is set to be 0, (ii) a power spectrum of a corresponding AD output is obtained when a sine wave having a single frequency is inputted into a corresponding DA, (iii) an output having a frequency equal to that of the inputted sine wave is determined as a fundamental harmonic, and (iv) an amplitude value of the fundamental harmonic and amplitude values of odd-order harmonics of the fundamental harmonic are measured. From a result of the measurement, the compensation table is created based on calculation formulas. Alternatively, the compensation value is determined in such a manner that (i) the value of the output y is measured when the input x is supplied, (ii) the correspondence relationship between the output y and the input x is calculated out by the least square method, and (iii) the compensation value is determined from the result of the calculation. Then, if the DA conversion is carried out by use of the compensation table, the odd-order harmonics are suppressed.

In other words, advantages of the present invention may be expressed such that the effect of the present invention includes advantages as follows: (a) it is possible to improve an SNR and a THD+N, as compared with a ΔΣ modulation analogue-digital converter employing a full open loop technique; (b) it is possible to reduce costs with a simple circuit arrangement in which an analogue feedback circuit is not provided to carry out a feedback from the SW amplifier; (c) since a nonlinear table is determined from harmonics measured based on the Fourier transform, it is possible to create a high-accuracy compensation table which is hardly affected by an accidental error in a measurement system; (d) the present invention can be applied to various SW amplifiers only by rewriting the compensation table; (e) as to the odd-order harmonics, if the odd-order harmonics and the input signal have either in-phase components, or out-of-phase components, it is possible to suppress a component higher than a third-order harmonic component; and (f) it is possible to contribute to power conservation by suppressing unnecessary harmonic components of an output of an amplifier.

In the aforementioned description, the input signal is a sine wave. However, the input signal is not limited to a sine wave, but may be a triangular wave, a rectangular wave, or the like.

Further, the compensation function described in First Embodiment corresponds to a first compensation function recited in Claims.

Second Embodiment

In First Embodiment, the description is made for a case where one compensation value is provided for one ΔΣ modulation digital-analogue converter. However, the present invention is not limited to this, and a plurality of compensation values may be prepared in one ΔΣ modulation digital-analogue converter in advance. For example, it is possible to provide, for each impedance of speakers, a compensation value stored in the nonlinear compensation circuit 6. It should be noted that in the present embodiment, descriptions only deal with differences between the present embodiment and First Embodiment, and explanations of the common features are omitted here.

Figure 16:
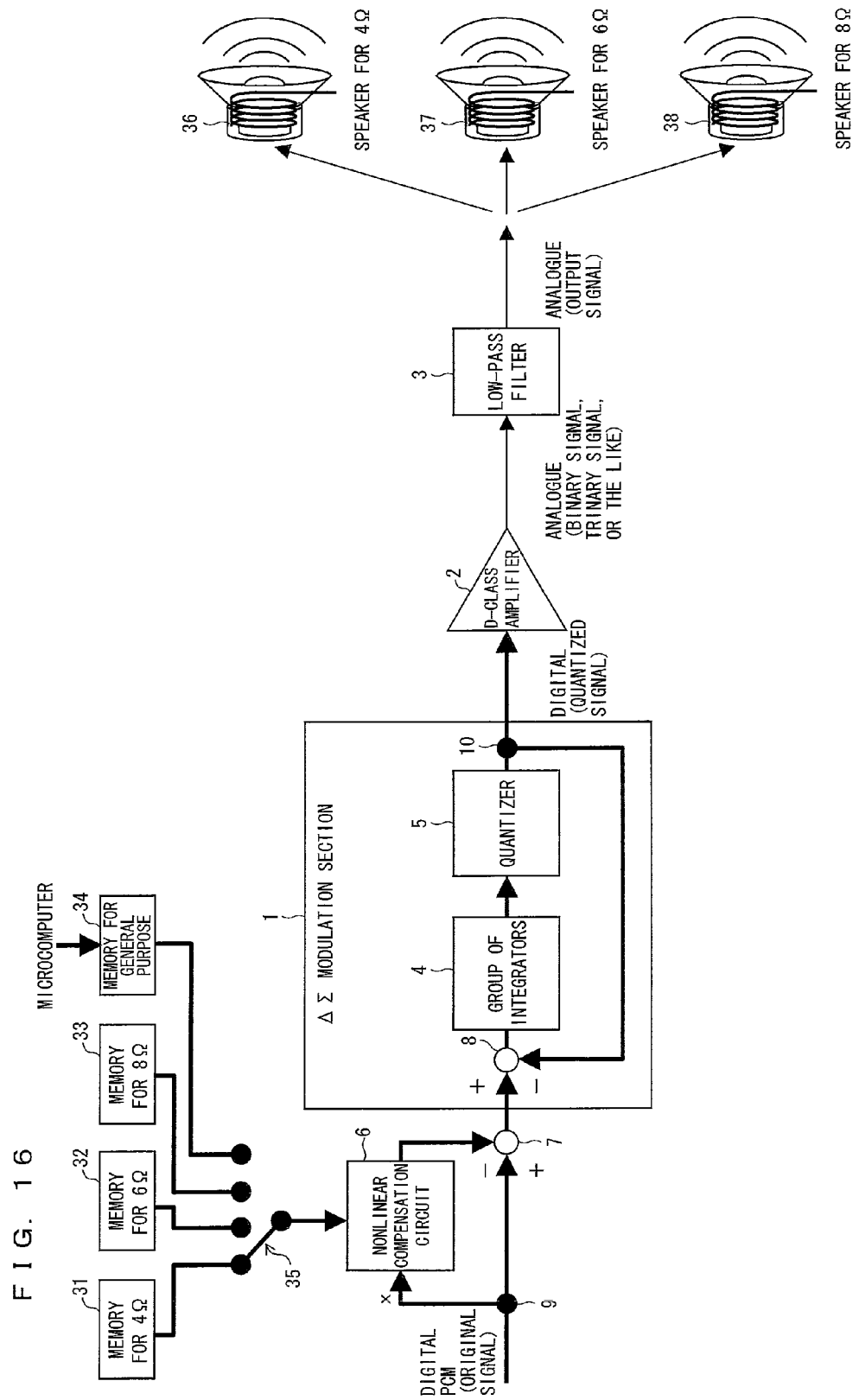
FIG. 16 is a view schematically illustrating a $\Delta\Sigma$ modulation digital-analogue converter of a second embodiment of the present invention.

A ΔΣ modulation digital-analogue converter of the present embodiment includes: a compensation value memory (for 4Ω) 31 suitable for a 4Ω speaker 36; a compensation value memory (for 6Ω) 32 suitable for a 6Ω speaker 37; a compensation value memory (for 8Ω) 33 suitable for a 8Ω speaker 38; a compensation value (for a general purpose) 34 for a general-purpose speaker (not illustrated); and a selector switch 35, as illustrated in FIG. 16.

In a case where the speaker 36 having an impedance of 4Ω is provided to the ΔΣ modulation digital-analogue converter, a compensation value stored in the compensation value memory (for 4Ω) 31 is inputted into the nonlinear compensation circuit 6. In the same manner, in a case where the speaker 37 having an impedance of 6Ω (or the speaker 38 having an impedance of 8Ω) is provided to the ΔΣ modulation digital-analogue converter, a compensation value stored in the compensation value memory (for 6Ω) 32 (or the compensation value memory (for 8Ω) 33) is inputted into the nonlinear compensation circuit 6. Here, for easier explanation, the compensation value memory (for 4Ω) 31, the compensation value memory (for 6Ω) 32, the compensation value memory (for 8Ω) 33, and the compensation value memory (for a general purpose) 34 are provided separately from the nonlinear compensation circuit 6. However, nonlinear compensation circuits for 4Ω, 6Ω, 8Ω, and a nonlinear compensation circuit for a general purpose may be provided for the compensation value memories respectively.

Further, the compensation value memory "for a general purpose" may be a memory to which a compensation value that is most suitable for a speaker is written via a microcomputer in a case where a speaker having an impedance other than impedances of 4Ω, 6Ω, and 8Ω is provided. Furthermore, the compensation value memory "for a general purpose" may be a memory in which a common compensation value is stored for a speaker having an impedance of not less than 10Ω, for example.

Thus, by preparing the memories in which compensation values that are most suitable for impedances of speakers are stored respectively, it becomes possible to carry out an appropriate compensation without rewriting the compensation value even if a speaker is exchanged with another speaker. Further, with the memory for a general purpose prepared in advance, it becomes possible to, if necessary, (i) write a setting into the memory for a general purpose (register), which memory is connected to a microcomputer, and (ii) set a parameter that is most suitable for a speaker or a filter (network).

Third Embodiment

Unlike First Embodiment dealing with a case of "f(x)=d(x)(distortion function=compensation function)", the present embodiment deals with a case of "f(x)=−d(x)(distortion function=−compensation function)". That is, in First Embodiment, the harmonic distortion is suppressed by subtracting the output of the nonlinear compensation circuit from the original signal x. In other words, in First Embodiment, the subtractor 7 is provided. On the other hand, in the present embodiment, the harmonic distortion is suppressed by adding the output of the nonlinear compensation circuit 6 to the original signal x. That is, in the present embodiment, an adder is provided.

However, in the present embodiment, too, it is possible to (i) set the nonlinear compensation circuit 6 so that a signal having a sign opposite to that of the signal set by the output signal (compensation signal) of the nonlinear compensation circuit 6 is outputted, and (ii) employ the subtractor (subtracting means) 7 in place of the adder (adding means).

In First and Second Embodiments, the compensation value and the compensation function are determined without taking into consideration a magnitude of an amplitude value of the original signal. However, the compensation value and compensation function that are most suitable for a certain amplitude value are not always most suitable for another amplitude value. For example, in a case where (i) a compensation function that is most suitable for an amplitude value $a_{s1}$ is $f_1(x)$, (ii) a compensation function that is most suitable for an amplitude value $a_{s2}$ is $f_2(x)$, and (iii) a compensation function that is most suitable for an amplitude value $a_{s3}$ is $f_3(x)$, (1) $f_2(x)$ and $f_3(x)$ are not most suitable for the amplitude value $a_{s1}$, (2) $f_1(x)$ and $f_3(x)$ are not most suitable for the amplitude value $a_{s2}$, and (3) $f_1(x)$ and $f_2(x)$ are not most suitable for the amplitude value $a_{s3}$ (see FIG. 17).

Figure 17:
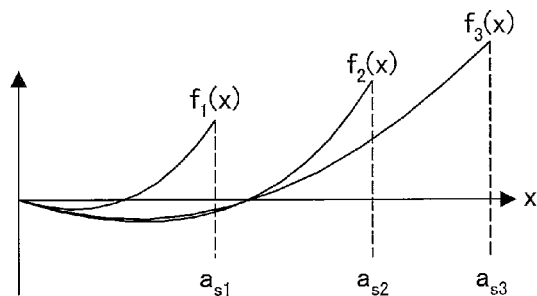
FIG. 17 is a graph showing a second compensation function for each amplitude.

This is because, if compensated outputs are shown in a vertical axis, and the amplitude values are shown in a lateral axis, the resulting curves do not overlap each other, and are different in shape from each other, as shown in FIG. 17. For example, in a case where the distortion compensation is carried out with the use of $f_3(x)$, an optimum distortion compensation can be carried out in the vicinity of the amplitude value $a_{s3}$, but cannot be carried out in the vicinity of the amplitude value $a_{s1}$. The present embodiment is made in view of the problem, and an object of the present embodiment is to carry out an optimum distortion compensation in a wider range of amplitude values. The following description deals with details of such a distortion compensation.

Figure 18:
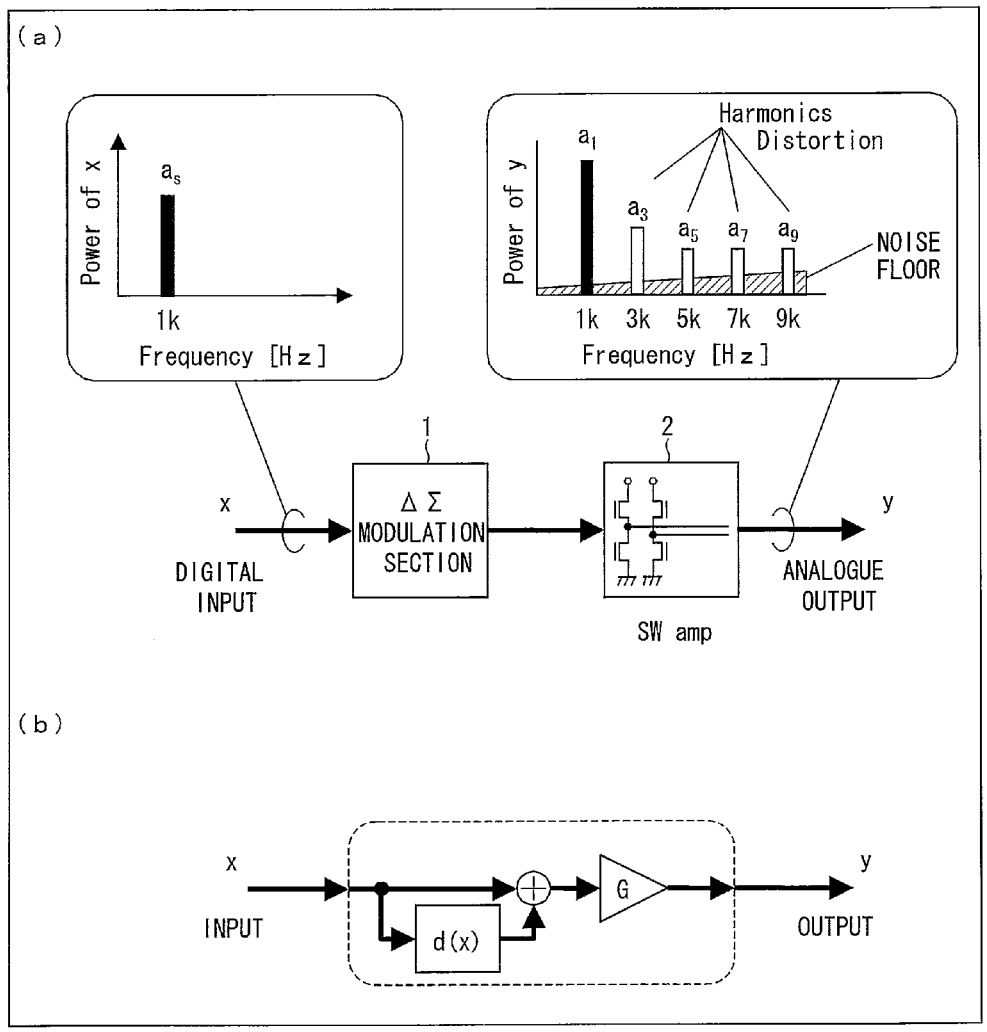
FIG. 18 is a view schematically illustrating an input and an output, and (a) of FIG. 18 is a view illustrating the input and the output in a case where a nonlinear compensation is not carried out, and (b) of FIG. 18 is a view schematically illustrating (a) of FIG. 18.

Here, the following description is made for a case where harmonics having amplitude values $a_1$, $a_3$, $a_5$, $a_7$ and $a_9$, respectively, are generated from the output of the amplifier, when a sine wave having an amplitude value $a_s$ is inputted. As illustrated in (a) of FIG. 18, in a case where (i) the ΔΣ modulation section 1 is supplied with an input signal (digital input) having a frequency of 1 k[Hz] and an amplitude value as, and (ii) the nonlinear compensation is not carried out (that is, in a case where an operation of the nonlinear compensation circuit 6 is stopped), the switching amplifier (D-Class amplifier) 2 outputs the harmonics having the amplitude values $a_1$, $a_3$, $a_5$, $a_7$ and $a_9$, respectively. (b) of FIG. 18 is a schematic view of an arrangement from the input to the output, in consideration of the ΔΣ modulation section 1, the switching amplifier 2, and distortion components.

That is, if the input is referred to as x, the output is referred to as y, and the gain of the fundamental harmonic from the input to the output is referred to as G, a model of the generation of the harmonics can be expressed by the following formula with the use of the nonlinear distortion function d(x).

$$y=G\{x+d(x)\} \tag{Formula 16}$$

Figure 19:
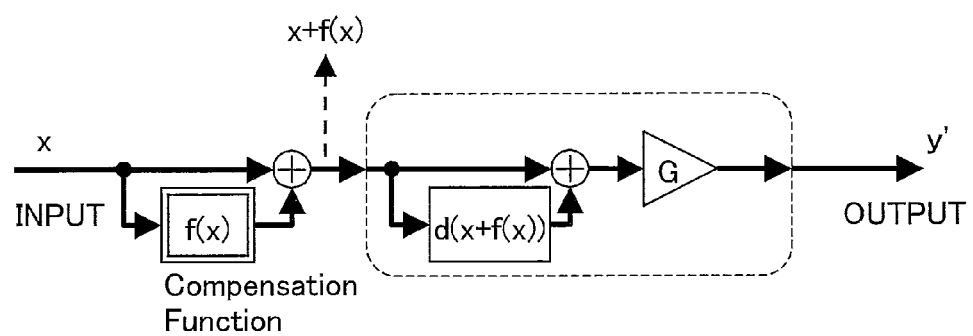
FIG. 19 is a view schematically illustrating the $\Delta\Sigma$ modulation digital-analogue converter of the present invention.

Next, as in First Embodiment, in the present embodiment, too, the nonlinear compensation circuit 6 is provided so as to compensate the input signal in the upstream of the ΔΣ modulation section 1. That is, as illustrated in FIG. 19, the harmonics are suppressed by adding a first compensation function f(x) to the input x. With the use of the first compensation function f(x), an output y' can be expressed by the following formula.

$$y'=G\{x+f(x)+d(x+f(x))\}$$

where $|f(x)|\ll|x|$. Here, an ideal output y' having no harmonics is expressed by the following formula.

$$y'=Gx$$

Here, by comparing these two formulas with each other, the following formula can be obtained.

$$Gx=G\{x+f(x)+d(x+f(x))\}$$

Both sides are divided by G, so that the following formula can be obtained.

$$x=\{x+f(x)+d(x+f(x))\}$$

Further, x is subtracted from both sides, so that the following formula can be obtained.

$$f(x)=-d(x+f(x))$$

That is, f(x) can be expressed by the following formula.

$$f(x)\approx-d(x)$$

Working out the compensation function (f(x)) is equal to estimating the distortion function (d(x)). Therefore, it is necessary to have a method for estimating the distortion function from the harmonics.

Here, the following description schematically explains a method of working out a compensation function (first compensation function) of the present embodiment.

(As to Working Out of Second Compensation Function)

First, the following description explains how to work out a compensation function for each amplitude value, and how to work out a factor of the compensation function. The compensation function for each amplitude value corresponds to a second compensation function recited in Claims.

The input x can be represented by the following formula.

$$x=a_s\sin(\omega t) \quad\text{(Formula 17)}$$

On the other hand, the output y including the odd-order harmonic distortion components can be represented by the following formula.

$$y=\sum_{n=1,odd}^{N} a_n\sin(n\omega t)$$

The amplitude value $a_s$ of the input is known data, and the output fundamental harmonic $a_1$, and the harmonic $a_n$ are measurable data. Here, a relationship of "d(x) nearly equals −f(x)" is substituted in Formula 16 so as to convert Formula 16 into the following formula.

$$f(x)=-y/G+x$$

From the formula 17, cat is determined. Further, the gain $G=a_1/a_s$, which is the gain of the fundamental harmonic from the input to the output, is substituted in the Formula 17. Thereby, the compensation function f(x) can be determined by the following formula.

$$f(x) = -\frac{a_s}{a_1}\sum_{n=3,odd}^{N} a_n\sin(n\arcsin(x/a_s)) \quad\text{Formula A}$$

With the aforementioned description, it can be seen that the compensation function f(x) can be determined from a parameter including: the amplitude $a_s$ (which is known data) of the input; the output fundamental harmonic $a_1$ (which is measurable data); and the harmonic $a_n$ (which is measurable data). However, in terms of easiness in combining functions, and easiness in calculation for realizing hardware (as described later), it is not easy to use the compensation function f(x) because the compensation function f(x) includes functions, such as "sin" and "a sin". Therefore, in the present embodiment, the compensation function f(x) is realized by polynomial representation of the following formula employing a factor $c_m$.

$$f(x) = \sum_{m=1}^{M} c_m x^n \quad\text{Formula B}$$

The factor "$c_m$" is represented by conversion of a matrix employing $a_s$, $a_1$, and $a_n$, so that it is possible to represent Formulas A and B. A proof of this will be described later.

Specifically, the following description deals with an example of working out the compensation function. Here, for easier explanation, the description deals with a case where the compensation is carried out up to the third-order harmonic.

From the relationship between the input and the output, both of which have been measured, the following formulas can be obtained.

$$x=a_s\sin(\omega t) \quad\text{(Formula 18)}$$

$$y=a_1\sin(\omega t)+a_3\sin(3\omega t) \quad\text{(Formula 19)}$$

$$G=a_1/a_3 \quad\text{(Formula 20)}$$

It should be noted that the gain G can be represented by Formula 20 because the fundamental harmonic having the amplitude value $a_s$ appears as $a_1$.

Further, said model of the generation of the harmonics establishes the following formula.

$$y=G\{x+d(x)\}\approx G\{x-f(x)\}$$

Thereby, the following formula can be obtained.

$$y/G=x-f(x)$$

The distortion function d(x) has a sign that is opposite to that of the compensation function f(x), as described above.

Therefore, f(x) can be represented by the following formula.

$$f(x)=-(y/G)+x \quad\text{(Formula 21)}$$

Further, from Formula B, the polynomial representation that allows the compensations up to the third-order harmonic can be represented by the following Formula 22.

$$f(x)=c_1 x+c_3 x^3 \quad\text{(Formula 22)}$$

By substituting Formula 18 in Formula 22, the following Formula 23 can be obtained.

$$f(x)=c_1 a_s\sin(\omega t)+c_3\{a_s\sin(\omega t)\}^3 \quad\text{(Formula 23)}$$

Here, as a first term on a right side of Formula 23, a factor of $c_1$ appears with respect to the fundamental harmonic component. This is because the $c_1$ absorbs a change, due to an influence of the nonlinear compensation, in the gain G, so as to play a role of keeping the gain G to be constant (keeping a previous gain G and a following gain G to be the same).

By substituting Formulas 18 through 20 in Formula 21, Formula 21 is solved. As a result, the following formula can be obtained.

$$f(x) = -\frac{1}{a_1/a_s}\{a_1\sin(\omega t)+a_3\sin(3\omega t)\}+a_s\sin(\omega t) \quad\text{(Formula 24)}$$

-continued $$= -\frac{a_s}{a_1}a_1\sin(\omega t) - \frac{a_s}{a_1}a_3\sin(3\omega t) + a_s\sin(\omega t)$$

$$= -a_s\sin(\omega t) - \frac{a_s a_3}{a_1}\sin(3\omega t) + a_s\sin(\omega t)$$

$$= -\frac{a_s a_3}{a_1}\sin(3\omega t)$$

With the use of Formulas 23 and 24, the following Formula 25 can be obtained.

$$-\frac{a_s a_3}{a_1}\sin(3\omega t) = c_1 a_s \sin(\omega t) + c_3 a_s^3 \sin(\omega t)^3 \quad \text{(Formula 25)}$$

By applying an arithmetic rule of the following Formula 26 to Formula 25, Formula 25 is converted into the following Formula 27.

$$\{\sin(\omega t)\}^3 = \frac{3}{4}\sin(\omega t) - \frac{1}{4}\sin(3\omega t) \quad \text{(Formula 26)}$$

$$-\frac{a_s a_3}{a_1}\sin(3\omega t) = c_1 a_s \sin(\omega t) + c_3 a_s^3 \sin(\omega t)^3 \quad \text{(Formula 27)}$$

$$-\frac{a_s a_3}{a_1}\sin(3\omega t) =$$

$$c_1 a_s \sin(\omega t) + c_3 a_s^3 \left\{\frac{3}{4}\sin(\omega t) - \frac{1}{4}\sin(3\omega t)\right\}$$

$$-\frac{a_s a_3}{a_1}\sin(3\omega t) = c_1 a_s \sin(\omega t) +$$

$$c_3 a_s^3 \frac{3}{4}\sin(\omega t) - c_3 a_s^3 \frac{1}{4}\sin(3\omega t)$$

By comparing factors of sin (nωt) in Formula 27 with each other, the following two simultaneous equations (Formulas 28 and 29) can be obtained.

$$0 = c_1 a_s + \frac{3}{4}c_3 a_s^3 \quad \text{(Formula 28)}$$

$$-\frac{a_s a_3}{a_1} = -\frac{1}{4}c_3 a_s^3 \quad \text{(Formula 29)}$$

From Formula 29, the following Formula 30 can be obtained.

$$c_3 = \frac{4a_3}{a_s^2 a_1} \quad \text{(Formula 30)}$$

By substituting Formula 30 in Formula 28, the following Formula 31 can be obtained. Further, by solving Formula 31, the following Formula 32 can be obtained.

$$0 = c_1 a_s + \frac{3}{4}\left(\frac{4a_3}{a_s^2 a_1}\right)a_s^3 \quad \text{(Formula 31)}$$

$$c_1 = -\frac{3a_3}{a_1} \quad \text{(Formula 32)}$$

By substituting Formulas 30 and 32 in Formula 22, the following compensation function f(x) can be obtained. That is, from the known data, and the measurable data, the compensation function f(x) can be obtained.

$$f(x) = -\frac{3a_3}{a_1}x + \frac{4a_3}{a_s^2 a_1}x^3$$

Next, the following description explains a method of determining, in a case of a single amplitude, (i) a compensation function that compensates the harmonics not less than the third-order harmonic, and (ii) a factor of the compensation function. That is, the following description deals with a case where the compensation is carried out with respect to up to the n-order harmonic.

From the relationship between the input and the output, both of which have been measured, the following formula can be obtained.

$$x = a_s \sin(\omega t) \quad \text{(Formula 33)}$$

$$y = \sum_{n=1,odd}^{N} a_n \sin(n\omega t) \quad \text{(Formula 34)}$$

Since the fundamental harmonic having the amplitude value $a_s$ appears as $a_1$, the gain G can be represented by the following Formula 35.

$$G = a_1/a_s \quad \text{(Formula 35)}$$

Further, from said model of the generation of the harmonics, the following Formula 36 can be obtained. Then, the following Formula 37 can be obtained from Formula 36.

$$y = G\{x + d(x)\} \approx G\{x - f(x)\} \quad \text{(Formula 36)}$$

$$y/G = x - f(x) \quad \text{(Formula 37)}$$

As described above, the distortion function d(x) has a sign that is opposite to that of the compensation function f(x).

Therefore, f(x) can be represented by the following formula.

$$f(x) = -(y/G) + x \quad \text{(Formula 38)}$$

Further, the polynomial representation that allows the compensations with respect to up to the n-order harmonic can be represented by the following Formula 39.

$$f(x) = \sum_{m=1,odd}^{N} c_m x^m \quad \text{(Formula 39)}$$

By substituting Formula 33 in Formula 39, the following Formula 40 can be obtained.

$$f(x) = \sum_{m=1,odd}^{N} c_m \{a_s \sin(\omega t)\}^m \quad \text{(Formula 40)}$$

Next, by substituting Formulas 33 through 35 in Formula 38, and further, by solving Formula 38, the following Formula 41 can be obtained.

$$\begin{aligned}f(x) &= -\frac{1}{a_1/a_s}\left(\sum_{n=1,odd}^{N} a_n \sin(n\omega t)\right) + a_s \sin(\omega t) \\ &= -\frac{a_s}{a_1} \sum_{n=1,odd}^{N} a_n \sin(n\omega t) + a_s \sin(\omega t) \\ &= -\frac{a_s}{a_1} a_1 \sin(\omega t) - \frac{a_s}{a_1} \sum_{n=3,odd}^{N} a_n \sin(n\omega t) + a_s \sin(\omega t) \\ &= -\frac{a_s}{a_1} \sum_{n=3,odd}^{N} a_n \sin(n\omega t)\end{aligned} \quad \text{(Formula 41)}$$

From Formulas 40 and 41, the following Formula 42 can be obtained.

$$-\frac{a_s}{a_1} \sum_{n=3,odd}^{N} a_n \sin(n\omega t) = \sum_{m=1,odd}^{N} c_m \{a_s \sin(\omega t)\}^m \quad \text{(Formula 42)}$$

Further, by applying an arithmetic rule of the following Formula 43 to Formula 42, Formula 42 is converted into Formula 43. Further, Formula 43 can be represented by the following Formula 44.

$$\{\sin(\omega t)\}^m = \sum_{n=1}^{m} b_{(m,n)} \sin(n\omega t) \quad \text{(Formula 43)}$$

$$-\frac{a_s}{a_1} \sum_{n=3,odd}^{N} a_n \sin(n\omega t) = \sum_{m=1,odd}^{N} c_m a_s^m \sum_{n=1}^{m} b_{(m,n)} \sin(n\omega t) \quad \text{(Formula 44)}$$

$$-\frac{a_s}{a_1} \sum_{n=3,odd}^{N} a_n \sin(n\omega t) = \sum_{n=1}^{N} \sum_{m=n,odd}^{N} a_s^m c_m b_{(m,n)} \sin(n\omega t) \quad \text{(Formula 45)}$$

In a case of "m=3", the arithmetic rule expressed by Formula 43 can be represented by the following formula.

$$\{\sin(\omega t)\}^3 = (3/4)\sin(\omega t) - (1/4)\sin(3\omega t)$$

Each factor $b_{(3,n)}$ can be expressed as described below.

$b_{(3,1)} = 3/4$ $b_{(3,3)} = -1/4$ $b_{(3,n)} = 0 (n \neq 1,3)$

Other than the case of "m=3", $b_{(m,n)}$ has been determined in advance in the development of the equation, in the same manner.

By comparing a factor of the sin(nωt) on the right side of Formula 45 with that on the left side of Formula 45, the following Formulas 46 and 47 can be obtained.

$$0 = \sum_{m=1,odd}^{N} a_s^m c_m b_{(m,1)} \quad \text{(Formula 46)}$$

$$-\frac{a_s a_n}{a_1} = \sum_{m=n,odd}^{N} a_s^m c_m b_{(m,n)} \quad \text{(Formula 47)}$$

Next, a variable $a_n'$ is newly defined as described below.

$a_1' = 0$ $a_n' = a_s a_n / a_1$

From these formulas, Formulas 46 and 47 are converted into the following Formula 48.

$$-a_n' = \sum_{m=n,odd}^{N} a_s^m c_m b_{(m,n)} \quad \text{(Formula 48)}$$

Further, by newly defining Formula 49, Formula 48 is converted into Formula 50.

$$q_m = a_s^m c_m \quad \text{(Formula 49)}$$

$$-a_n' = \sum_{m=n,odd}^{N} q_m b_{(m,n)} \quad \text{(Formula 50)}$$

Furthermore, by rewriting Formula 50 for cases of "n=1", "n=2", "n=5", ..., the following Formulas 51, 52, and 53 can be obtained.

$$-a_1' = \sum_{m=1,odd}^{N} q_m b_{(m,1)} \quad \text{(Formula 51)}$$

$$-a_3' = \sum_{m=3,odd}^{N} q_m b_{(m,3)} \quad \text{(Formula 52)}$$

$$-a_5' = \sum_{m=5,odd}^{N} q_m b_{(m,5)} \quad \text{(Formula 53)}$$

Moreover, by rewriting Formulas 51, 52, and 53 into a form of a matrix, the following Formulas 54, 55, and 56 can be obtained.

$$-a_1' = [q_1 \ q_3 \ q_5 \ \cdots \ q_N] \begin{bmatrix} b_{(1,1)} \\ b_{(3,1)} \\ b_{(5,1)} \\ \vdots \\ b_{(N,1)} \end{bmatrix} \quad \text{(Formula 54)}$$

-continued $$-a'_3 = \begin{bmatrix} q_1 & q_3 & q_5 & \cdots & q_N \end{bmatrix} \begin{bmatrix} 0 \\ b_{(3,3)} \\ b_{(5,3)} \\ \vdots \\ b_{(N,3)} \end{bmatrix} \quad \text{(Formula 55)}$$

$$-a'_5 = \begin{bmatrix} q_1 & q_3 & q_5 & \cdots & q_N \end{bmatrix} \begin{bmatrix} 0 \\ 0 \\ b_{(5,5)} \\ \vdots \\ b_{(N,5)} \end{bmatrix} \quad \text{(Formula 56)}$$

By putting these into the form of the matrix, Formula 57 can be obtained.

$$-\begin{bmatrix} a'_1 & a'_3 & a'_5 & \cdots & a'_N \end{bmatrix} = \begin{bmatrix} q_1 & q_3 & q_5 & \cdots & q_N \end{bmatrix} \begin{bmatrix} b_{(1,1)} & 0 & 0 & & 0 \\ b_{(3,1)} & b_{(3,3)} & 0 & & 0 \\ b_{(5,1)} & b_{(5,3)} & b_{(5,5)} & \cdots & 0 \\ \vdots & \vdots & \vdots & & \vdots \\ b_{(N,1)} & b_{(N,3)} & b_{(N,5)} & & b_{(N,N)} \end{bmatrix} \quad \text{(Formula 57)}$$

Further, by converting $[q_1\ q_3\ q_5\ \ldots\ q_N]$ into the form of the matrix with the use of Formula 49, the following Formula 58 can be obtained.

$$\begin{bmatrix} q_1 & q_3 & q_5 & \cdots & q_N \end{bmatrix} = \begin{bmatrix} c_1 \\ c_3 \\ c_5 \\ \vdots \\ c_N \end{bmatrix} \begin{bmatrix} a_s & 0 & 0 & & 0 \\ 0 & a_s^3 & 0 & & 0 \\ 0 & 0 & a_s^5 & & 0 \\ \vdots & \vdots & \vdots & \cdots & \vdots \\ 0 & 0 & 0 & & a_s^N \end{bmatrix} \quad \text{(Formula 58)}$$

By applying Formula 58 to Formula 57, the following Formula 59 can be obtained.

$$-\begin{bmatrix} a'_1 & a'_3 & a'_5 & \cdots & a'_N \end{bmatrix} = \begin{bmatrix} c_1 \\ c_3 \\ c_5 \\ \vdots \\ c_N \end{bmatrix} \begin{bmatrix} a_s & 0 & 0 & & 0 \\ 0 & a_s^3 & 0 & & 0 \\ 0 & 0 & a_s^5 & & 0 \\ \vdots & \vdots & \vdots & \cdots & \vdots \\ 0 & 0 & 0 & & a_s^N \end{bmatrix} \begin{bmatrix} b_{(1,1)} & 0 & 0 & & 0 \\ b_{(3,1)} & b_{(3,3)} & 0 & & 0 \\ b_{(5,1)} & b_{(5,3)} & b_{(5,5)} & \cdots & 0 \\ \vdots & \vdots & \vdots & & \vdots \\ b_{(N,1)} & b_{(N,3)} & b_{(N,5)} & & b_{(N,N)} \end{bmatrix} \quad \text{(Formula 59)}$$

By providing the matrix on the left side as "a", a first matrix from the left on the right side as "c", a second matrix from the left on the right side as "S", and a third matrix from the left on the right side as "B", Formula 59 can be represented by the following formula.

$$-a = cSB$$

If "c" is obtained by modifying the formula of the matrix, the following formula can be obtained.

$$c = -a(SB)^{-1}$$

Therefore, $c_m$ can be determined by use of a calculator. That is, it can be seen that (i) by converting the matrix constituted by the amplitude value $a_s$ of the input (which is known data), the output fundamental harmonic $a_1$ (which is measurable data), and the harmonic $a_n$ (which are measurable data), $c_m$ is obtained, and therefore (ii) f(x) can be expressed in the form of a polynomial equation expressed by Formula B. Thus, as described above, the compensation function f(x) can be obtained.

(Combination of Second Compensation Functions)

Next, the compensation functions f(x) are combined, which have been obtained in accordance with the amplitude values. Following description deals with a procedure of the combination.

First, for easier explanation, the following description explains a method of combining two compensation functions $f_1(x)$ and $f_2(x)$.

Figure 20:
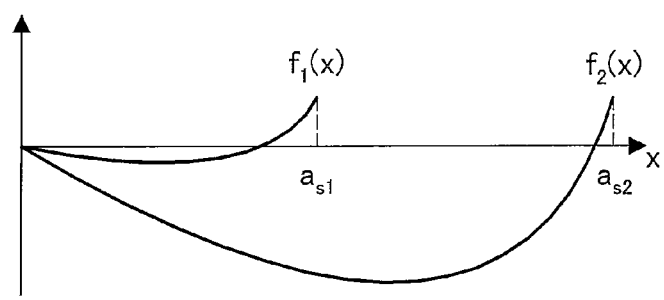
FIG. 20 is a graph showing each of compensation functions for amplitudes $a_{s1}$ and $a_{s2}$ of an input signal.

The $f_1(x)$ and $f_2(x)$ are as shown in FIG. 20. As shown in FIG. 20, curves of the $f_1(x)$ and $f_2(x)$, which have been determined from two different amplitude values, generally do not overlap each other, in practice. Accordingly, for appropriate combination of these functions, the point is how appropriately $f_1(x)$ is combined with $f_2(x)$ while reflecting the curve of $f_2(x)$.

It should be noted that a function (graph) of $f_1(x)$ can be tilted by a minute number "α" compared with $a_{s1}$. In this case, the gain in an interval of $[0:a_{s1}]$ changes to a certain degree, but the change does not cause any problems. In order to carry out the combination by use of this characteristic, $f_1(x)$ is tilted by a minute number a so as to be close to the curve of $f_2(x)$ as much as possible.

Figure 21:
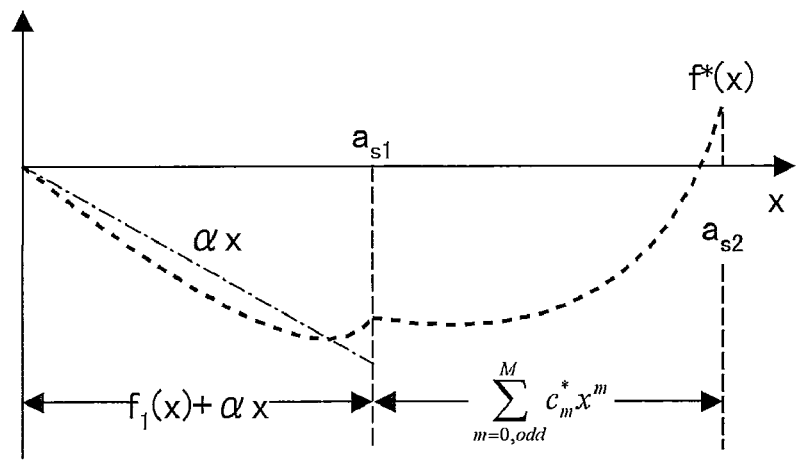
FIG. 21 is a graph showing a function obtained by combining two compensation functions shown in FIG. 20.
Figure 22:
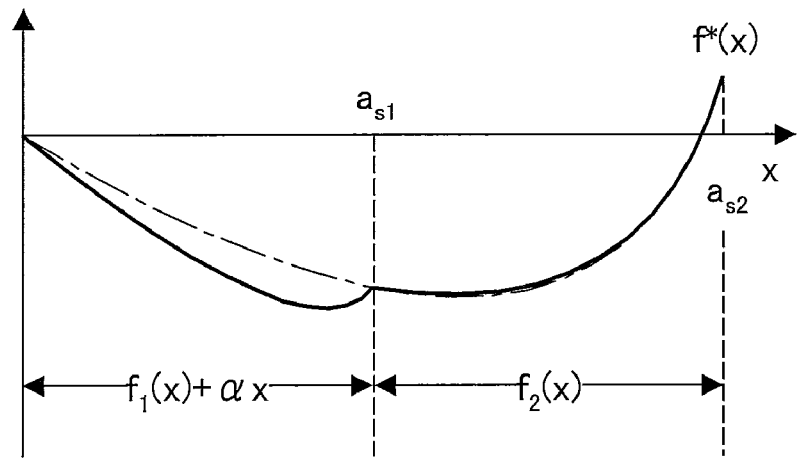
FIG. 22 is a graph showing a function obtained by combining two compensation functions shown in FIG. 20.

If the graph of $f_1(x)$ is tilted, and the combination of the two functions is carried out at a point $a_{si}$, the graph will be as shown in FIG. 21. Here, if a combined function f*(x) is obtained so that a square accidental error E (Formula 60) between f*(x) and $f_2(x)$ becomes a minimum, the graph will be as shown in FIG. 22. If f*(x) is calculated according to the condition described above, Formula 61 can be derived.

$$E = \int_0^{a_{s2}} \{f_2(x) - f^*(x)\}^2 dx \quad \text{(Formula 60)}$$

$$f^*(x) = \begin{cases} f_1(x) + \alpha x & |x| < |a_{s1}| \\ f_2(x) & \text{otherwise} \end{cases}$$

$$\alpha = 3 \sum_{m=1}^{M} \frac{c(2,m) - c(1,m)}{m+2} a_{s1}(m-1)$$

$c(2,m)$=a factor of $x^m$ of $f_2(x)$ $c(1,m)$=a factor of $x^m$ of $f_1(x)$    (Formula 61)

According to the result of the derivation, an optimum combined function f*(x) is considered as such a function that (i) $f_1(x)$ is tilted by a so that a gradient of $f_1(x)$ becomes the same as a gradient of $f_2(x)$ in the interval of $[0:a_{s1}]$, and (ii) the two functions of $f_1(x)$ and $f_2(x)$ are combined (synthesized) with each other at the point $a_{s1}$.

Figure 23:
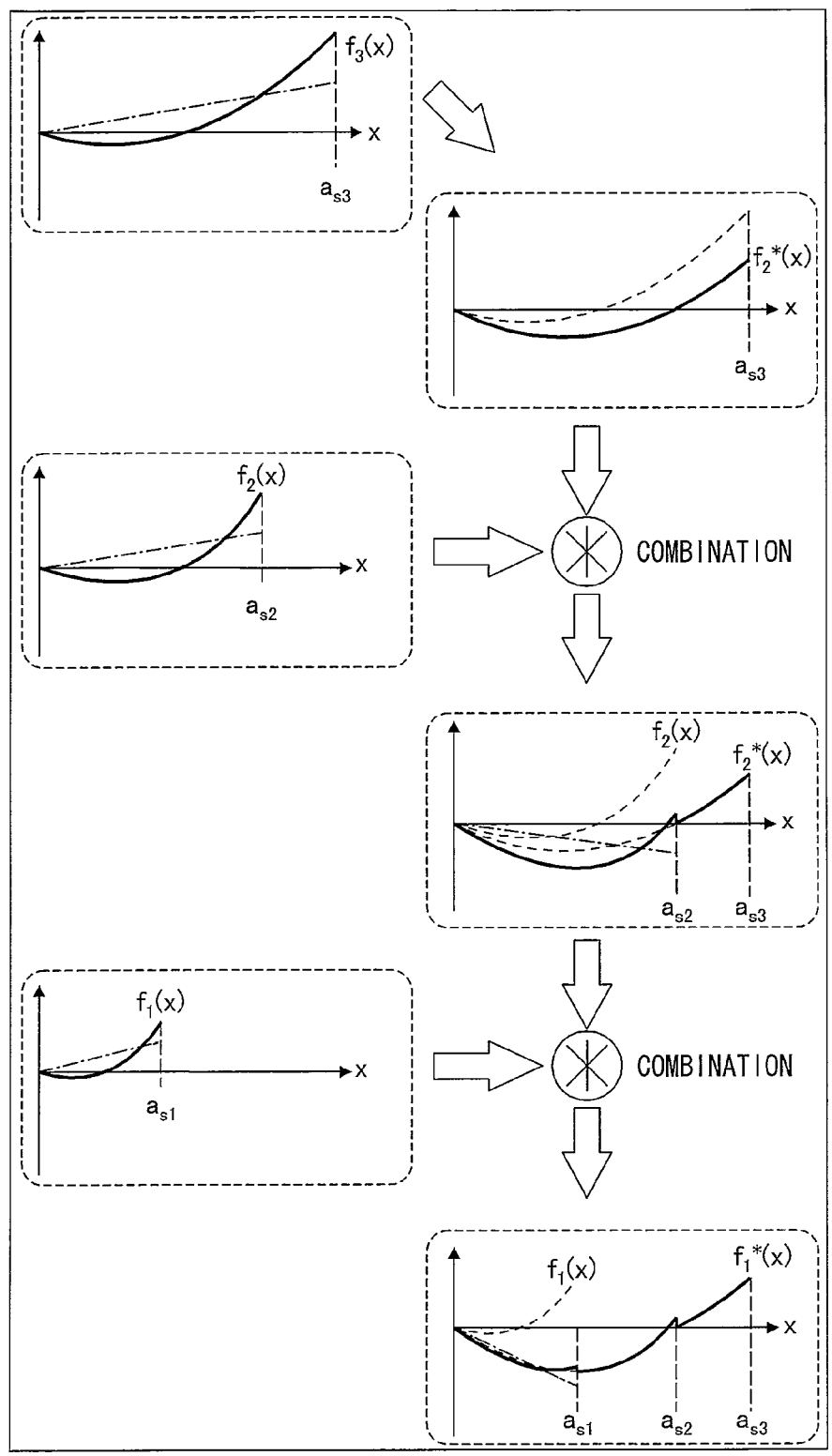
FIG. 23 is a view illustrating a flow of combination of the compensation functions.

This method for combining two functions can be also applied to a case where not less than three graphs are provided (see FIG. 23). That is, combination of a compensation function corresponding to a second-largest amplitude value and a compensation function corresponding to a largest amplitude value is carried out such that the compensation function corresponding to the second-largest amplitude value is tilted in accordance with the compensation function corresponding to the largest amplitude value. Further, combination of the combined compensation function and a compensation function corresponding to a third-largest amplitude value is carried out in the same manner as described above. By continuing to carry out such combination in the same manner, one combined function is created.

(Curve Fitting)

Figure 24:
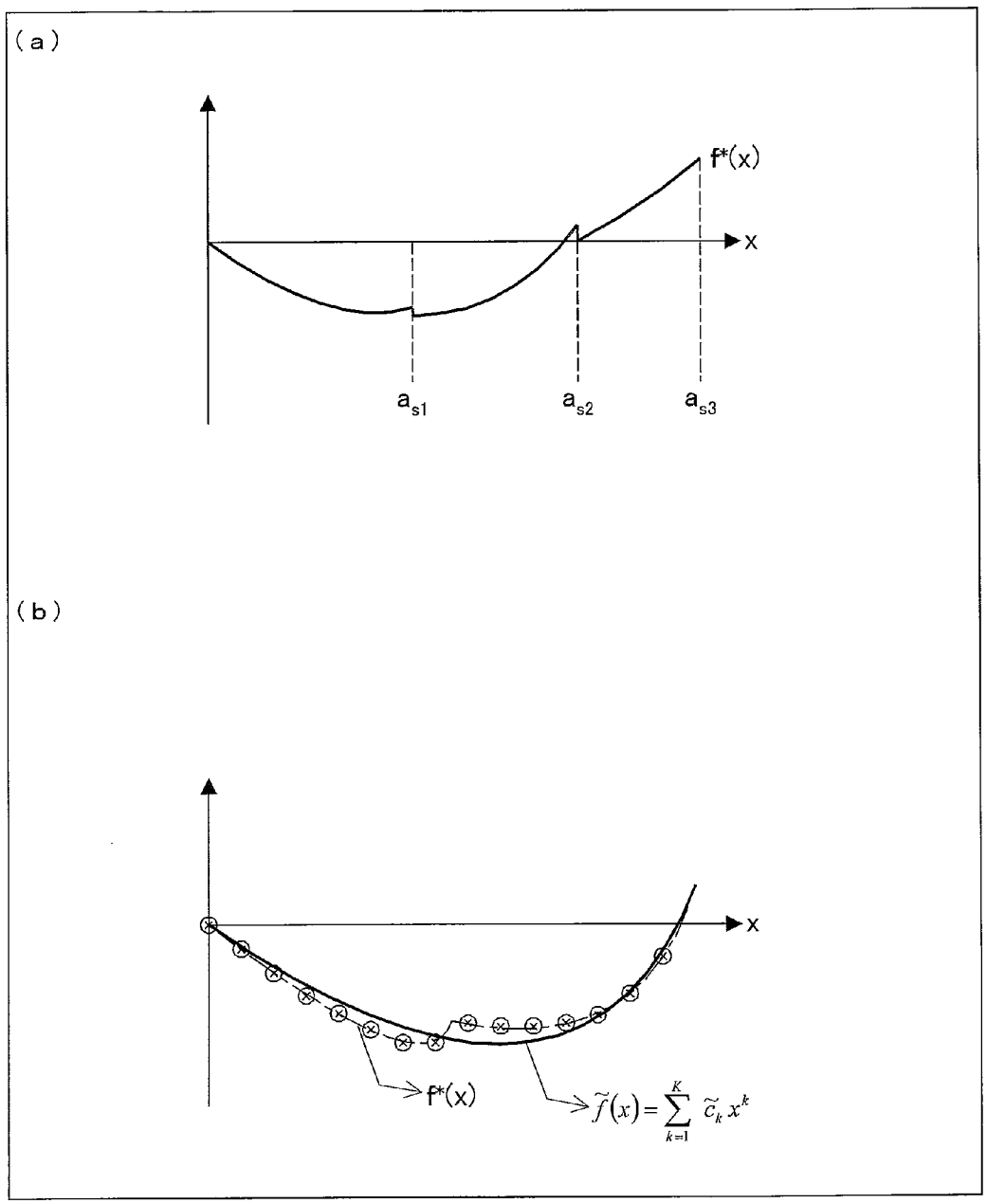
FIG. 24 is a graph for an explanation of curve fitting, and (a) of FIG. 24 is a graph showing a combined compensation function, and (b) of FIG. 24 is a graph showing such a compensation function that the graph shown in (a) of FIG. 24 has been subjected to the curve fitting.

Further, the combined function created as described above is subjected to curve fitting. That is, (a) of FIG. 24 is subjected to the curve fitting so as to be (b) of FIG. 24.

This realizes the following effects.

(i) A function that is created merely combining functions requires factors as many as the number of the amplitude values. However, the curve fitting allows only one set of factors to express the compensation function, so that an amount of memory can be compressed.

(ii) It becomes unnecessary to switch over the factors between measured amplitude values. This can realize more convenient processing.

(iii) It becomes possible to reduce a bad influence on acoustic quality by eliminating discontinuous points.

The curve fitting can be carried out by use of the following Formula 62.

$$\tilde{y}_i = \tilde{f}(x_i) \quad \text{(Formula 62)}$$
$$= \sum_{k=1}^{K} \tilde{c}_k x_i^k$$

Figure 25:
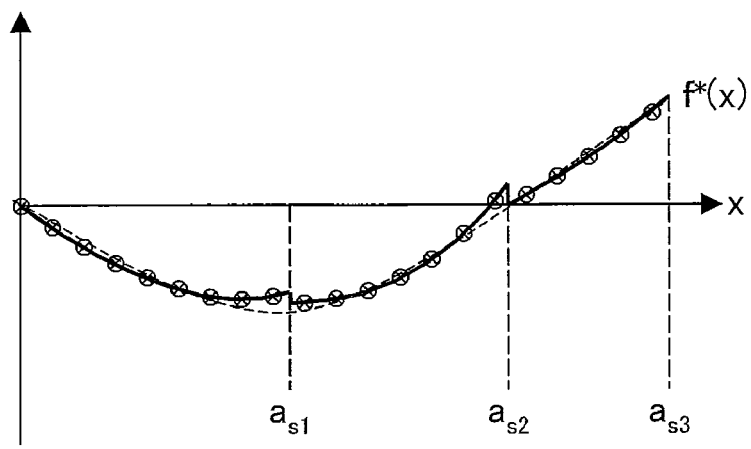
FIG. 25 is a graph showing a sample of the curve fitting.
Figure 26:
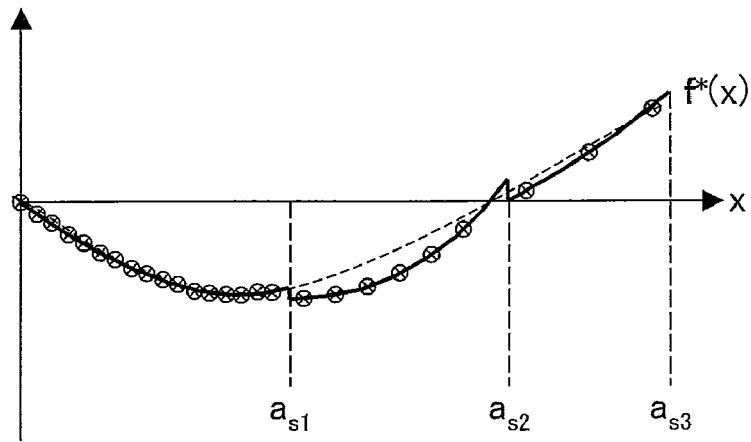
FIG. 26 is a graph showing a sample of the curve fitting.

Note that intervals between samples used in an approximation of the curve fitting may be, as shown in FIG. 25, provided equally. Alternatively, as shown in FIG. 26, the intervals may have high density in the vicinity of a small amplitude region that has a great influence on a performance of a valley of a THD, so that precision of the approximation during a small amplitude period can be improved.

By limiting the approximation to odd-order ranges (excluding even-order ranges), it becomes possible to prevent over-fitting. Here, the over-fitting means that an excess increase in the number of parameters causes the fitting curve to be sensitive to an accidental error of mathematical calculation, so that the fitting curve has an unnatural waveform.

Figure 27:
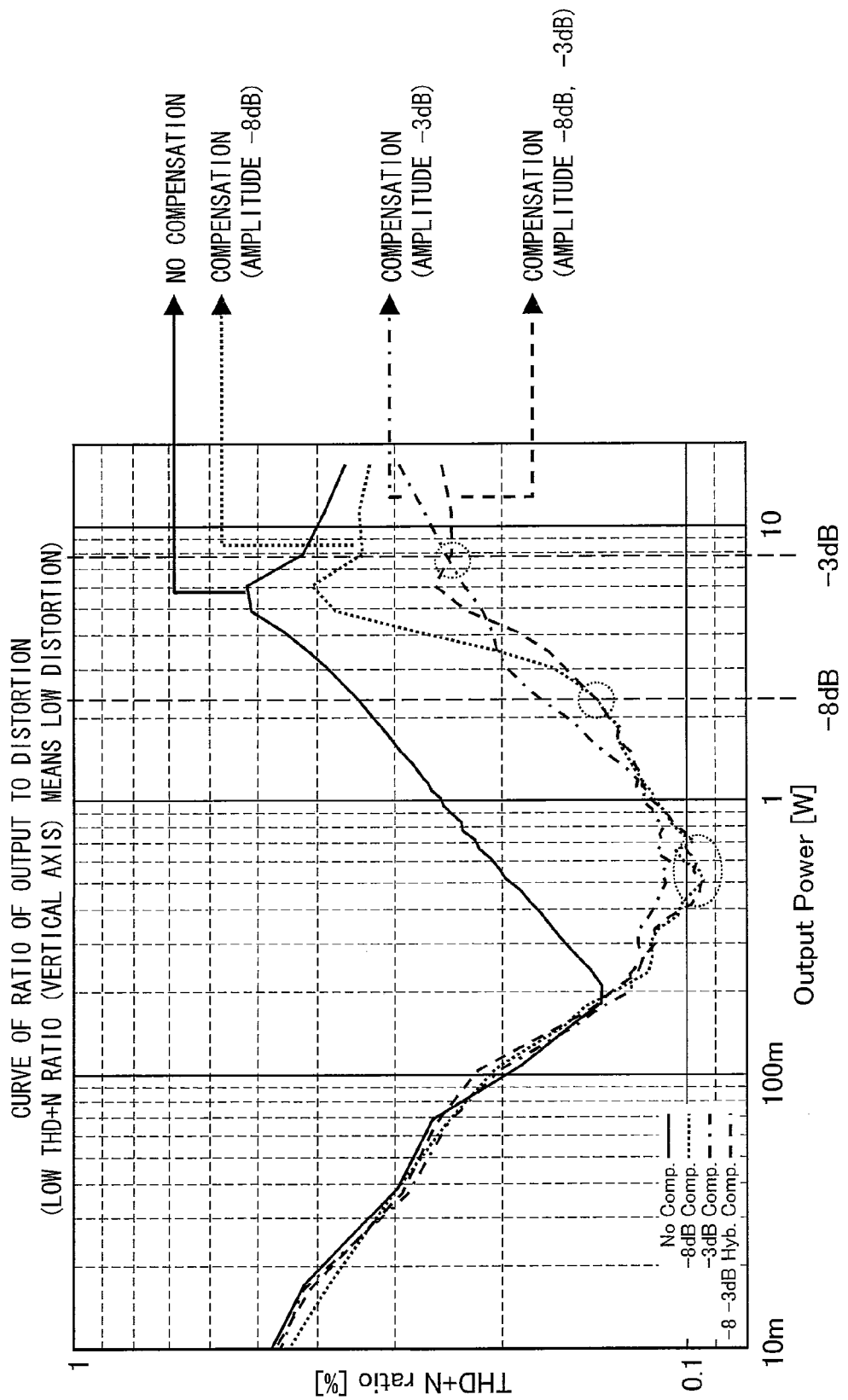
FIG. 27 is an experimental result showing an effect of a third embodiment of the present invention.

The present embodiment achieves the following advantages. For example, among a case (a) where the compensation is not carried out, a case (b) where the compensation is carried out in accordance with an amplitude value of −8 dB, a case (c) where the compensation is carried out in accordance with amplitude value of −3 dB, and a case (d) where the compensation is carried out in accordance with amplitude values −8 dB and −3 dB, if curves of a ratio of the output to distortion are compared with each other, the distortion is suppressed in a widest range in the case (d) where the compensation is carried out in accordance with the amplitude values of −8 dB and −3 dB (see FIG. 27).

Figure 28:
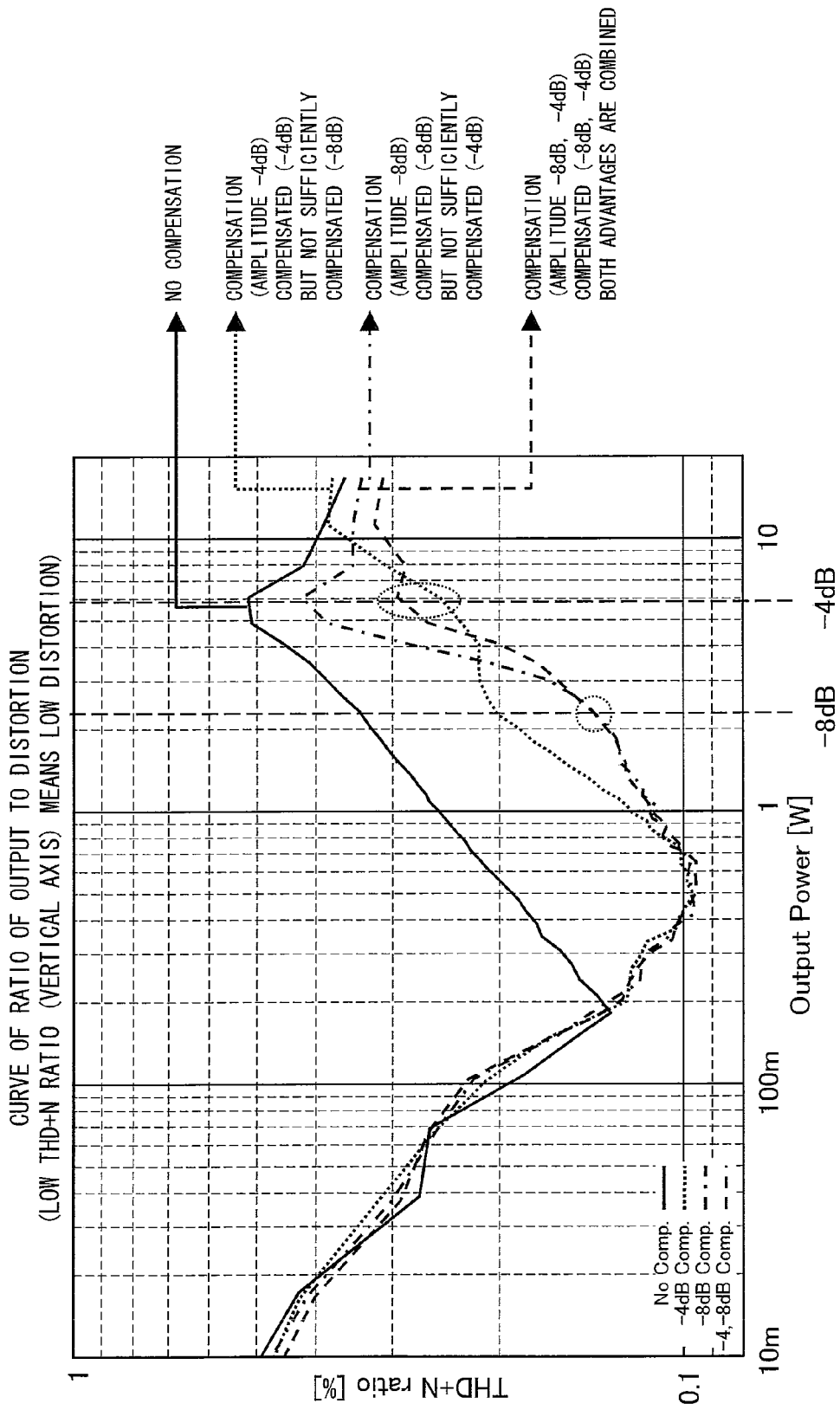
FIG. 28 is an experimental result showing the effect of the third embodiment of the present invention.

In the same manner, among the case (a) where the compensation is not carried out, the case (b) where the compensation is carried out in accordance with an amplitude value of −8 dB, a case (c) where the compensation is carried out in accordance with an amplitude value of −4 dB, and a case (d) where the compensation is carried out in accordance with amplitude values of −8 dB and −4 dB, if the curves of the ratio of the output to the distortion are compared with each other, the distortion is suppressed in the widest range in the case (d) where the compensation is carried out in accordance with the amplitude values of −8 dB and −4 dB (see FIG. 28).

(Additional Matter Regarding Model of Generation of Distortion)

The present inventions are common in that the distortion is generated depending on the input x. However, with the present invention, not a unique model but a plurality of models are used for the model of the generation of the distortion. An adequacy or appropriateness of the model is determined depending on whether or not the distortion is cancelled when the method of reducing the distortion by using the model is worked out and applied. The present invention explains three kinds of model among various models of the generation of the distortion.

Specifically, the first model is "y=x+d(x)" shown in FIGS. 4 and 5, and explained in the above column of the second method of working out the compensation value, the second model is "y=Gx+d(x)" explained in the column of the first method of working out the compensation value, and the third model is "y=G(x+d(x))" explained in the third embodiment. Among these models, the first model is most suitable for easy explanation of the principle of realizing suppression of the distortion.

Further, any of the ΔΣ modulation digital-analogue converters described above can be applied to AV equipment (AV device) such as audio equipment or a television.

The present invention is not limited to the description of the embodiments above, but may be altered by a skilled person within the scope of the claims. An embodiment based on a proper combination of technical means disclosed in different embodiments is encompassed in the technical scope of the present invention.

As described above, a ΔΣ modulation digital-analogue converter of the present invention includes: ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means; a switching amplifier for generating a switching pulse in accordance with the quantized signal; a low-pass filter for demodulating the switching pulse; storage means in which a first compensation function is stored in advance, the first compensation function indicating a correspondence relationship between each of a plurality of possible input values of an input signal which is externally supplied, and each of compensation values that are individually associated with the possible input values; and compensation means for compensating the input signal which is externally supplied, based on a compensation value associated with the input signal among the compensation values, and supplying to the ΔΣ modulation means the input signal thus compensated; the first compensation function being set based on a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency-analysis without a compensation carried out with respect to the input signal by the compensation means.

Further, a ΔΣ modulation digital-analogue converter of the present invention includes: ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means; a switching amplifier for generating a switching pulse in accordance with the quantized signal; a low-pass filter for demodulating the switching pulse; calculating means for calculating, in accordance with an output of the switching amplifier or an output of the ΔΣ modulation digital-analogue converter, each of compensation values that compensate individually a plurality of possible input values of an input signal which is externally supplied; and compensation means for compensating the input signal which is externally supplied, based on a compensation value associated with the input signal among the compensation values, and supplying to the ΔΣ modulation means the input signal thus compensated, the calculating means working out the compensation value based on magnitudes of a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency analysis without a compensation carried out with respect to the input signal by the compensation means.

Furthermore, as described above, a digital signal processing method of the present invention employs a ΔΣ modulation digital-analogue converter, the ΔΣ modulation digital-analogue converter including: ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means; a switching amplifier for generating a switching pulse in accordance with the quantized signal; a low-pass filter for demodulating the switching pulse, the method including: providing, to the ΔΣ modulation digital-analogue converter, storage means in which a first compensation function is stored in advance, the first compensation function indicating a correspondence relationship between each of a plurality of possible input values of an input signal which is externally supplied, and each of compensation values that are individually associated with the possible input values; and providing compensation means to the ΔΣ modulation digital-analogue converter and compensating, by the compensation means, the input signal which is externally supplied, based on a compensation value associated with the input signal among the compensation values, and supplying, by the compensation means, to the ΔΣ modulation means the input signal thus compensated, the first compensation function being set based on a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency-analysis without a compensation carried out with respect to the input signal by the compensation means.

Thus, it is possible to provide a ΔΣ modulation digital-analogue converter and a digital signal processing method, both of which suppress odd-order harmonics with an easy circuit arrangement, and thereby are excellent in an SNR and a THD+N.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

A ΔΣ modulation digital-analogue converter of the present invention is applicable to audio equipment, a television, or the like.

The invention claimed is:

1. A ΔΣ modulation digital-analogue converter comprising:
   ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means;
   a switching amplifier for generating a switching pulse in accordance with the quantized signal;
   a low-pass filter for demodulating the switching pulse;
   storage means in which a first compensation function is stored in advance, the first compensation function indicating a correspondence relationship between each of a plurality of possible input values of an input signal which is externally supplied, and each of compensation values that are individually associated with the possible input values; and
   compensation means for compensating the input signal which is externally supplied, based on a compensation value associated with the input signal among the compensation values, and supplying to the ΔΣ modulation means the input signal thus compensated;
   the first compensation function being set based on a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency-analysis without a compensation carried out with respect to the input signal by the compensation means.

2. The ΔΣ modulation digital-analogue converter according to claim 1, wherein:
   the first compensation function is obtained by combining second compensation functions, which are respectively for different amplitude values of the input signal, and indicate correspondence relationships between the possible input values and the compensation values for the different amplitude values, respectively.

3. The ΔΣ modulation digital-analogue converter according to claim 1, wherein:
   the first compensation function is obtained in such a manner that (i) second compensation functions, which are respectively for different amplitude values of the input signal, and respectively indicate correspondence relationships between the possible input values and the compensation values for the different amplitude value, are combined, and (ii) a resulting combined function is subjected to curve fitting.

4. The ΔΣ modulation digital-analogue converter according to claim 2, wherein:
the second functions are combined in such a manner that combination of a second function corresponding to a highest amplitude value and a second function corresponding to a second-highest amplitude value is carried out one by one sequentially.

5. The ΔΣ modulation digital-analogue converter according to claim 1, wherein:
the first compensation function is stored in the storage means per impedance of a load.

6. The ΔΣ modulation digital-analogue converter according to claim 5, wherein:
the load is a speaker.

7. The ΔΣ modulation digital-analogue converter according to claim 5, wherein:
the load is an electric circuit network to which a plurality of speakers are connected.

8. The ΔΣ modulation digital-analogue converter according to claim 1, wherein:
the ΔΣ modulation digital-analogue converter is capable of dealing with electric power for driving a load.

9. The ΔΣ modulation digital-analogue converter according to claim 1, further comprising:
subtracting means for (i) creating a difference signal by subtracting the compensation value from the input signal which is externally supplied, and (ii) inputting the difference signal into the ΔΣ modulation means.

10. The ΔΣ modulation digital-analogue converter according to claim 1, further comprising:
adding means for (i) creating a sum signal by adding the compensation value to the input signal which is externally supplied, and (ii) inputting the sum signal into the ΔΣ modulation means.

11. The ΔΣ digital-analogue converter according to claim 1, wherein:
the compensation value is inputted into the ΔΣ modulation means.

12. The ΔΣ modulation digital-analogue converter according to claim 9, wherein:
the compensation value is obtained by calculation in which amplitude values of the input signal and amplitude values of the odd-order harmonics are used.

13. The ΔΣ modulation digital-analogue converter according to claim 12, wherein:
the amplitude values of harmonics that are equal to or higher than a third-order harmonic are determined such that (i) in a case where the harmonics and a first-order harmonic have in-phase components, signs of the amplitude values are positive, and (ii) in a case where the harmonics and the first-order harmonic have out-of-phase components, the signs of the amplitude values are negative.

14. The ΔΣ modulation digital-analogue converter according to claim 9, wherein:
the compensation value is $y_i-(ax_i+b)$,
where:
the input signal which is externally supplied is not subjected to the compensation by the compensation means; and
a and b are worked out by a least square method from an input value $x_i$ (i=1, 2, ..., N; N is an integer more than 2) of the input signal, and an output value $y_i$ (i=1, 2, ..., N; N is an integer more than 2) of an output signal so that $E=\Sigma_{i=1}^{N}\{(ax_i+b)-y_i\}^2$ becomes its minimum.

15. The ΔΣ modulation digital-analogue converter according to claim 11, wherein:
the compensation value is $(1+a)x_i-y_i+b$,
where:
the input signal which is externally supplied is not subjected to the compensation by the compensation means; and
a and b are calculated by a least square method from an input value $x_i$ (i=1, 2, ..., N; N is an integer more than 2) of the input signal, and an output value $y_i$ (i=1, 2, ..., N; N is an integer more than 2) of an output signal so that $E=\Sigma_{i=1}^{N}\{(ax_i+b)-y_i\}^2$ becomes its minimum.

16. A ΔΣ modulation digital-analogue converter comprising:
ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means;
a switching amplifier for generating a switching pulse in accordance with the quantized signal;
a low-pass filter for demodulating the switching pulse;
calculating means for calculating, in accordance with an output of the switching amplifier or an output of the ΔΣ modulation digital-analogue converter, each of compensation values that compensate individually a plurality of possible input values of an input signal which is externally supplied; and
compensation means for compensating the input signal which is externally supplied, based on a compensation value associated with the input signal among the compensation values, and supplying to the ΔΣ modulation means the input signal thus compensated,
the calculating means working out the compensation value based on magnitudes of a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency analysis without a compensation carried out with respect to the input signal by the compensation means.

17. An AV device comprising a ΔΣ modulation digital-analogue converter according to claim 1.

18. A digital signal processing method which employs a ΔΣ modulation digital-analogue converter,
the ΔΣ modulation digital-analogue converter including:
ΔΣ modulation means including integrating means including at least one integrator for integrating a digital signal, and quantizing means for modulating an output of the integrating means into a quantized signal, the ΔΣ modulation means feeding back the quantized signal to an upstream of the integrating means;
a switching amplifier for generating a switching pulse in accordance with the quantized signal;
a low-pass filter for demodulating the switching pulse,
the method comprising:
providing, to the ΔΣ modulation digital-analogue converter, storage means in which a first compensation function is stored in advance, the first compensation function indicating a correspondence relationship between each of a plurality of possible input values of an input signal which is externally supplied, and each of compensation values that are individually associated with the possible input values; and providing compensation means to the ΔΣ modulation digital-analogue converter and compensating, by the compensation means, the input signal which is externally supplied, based on a compensation value associated with the input signal among the compensation values, and supplying, by the compensation means, to the ΔΣ modulation means the input signal thus compensated, the first compensation function being set based on a spectrum of odd-order harmonics whose frequencies are A times more than a frequency of the input signal (A is an odd number), the spectrum being obtained in such a manner that an output of the switching amplifier or an output of the ΔΣ modulation digital-analogue converter is subjected to a frequency-analysis without a compensation carried out with respect to the input signal by the compensation means.

* * * * *